(12) United States Patent
Werner et al.

(10) Patent No.: US 8,080,874 B1
(45) Date of Patent: Dec. 20, 2011

(54) PROVIDING ADDITIONAL SPACE BETWEEN AN INTEGRATED CIRCUIT AND A CIRCUIT BOARD FOR POSITIONING A COMPONENT THEREBETWEEN

(75) Inventors: Jeremy Werner, San Jose, CA (US); Daniel L. Rosenband, San Mateo, CA (US); Jeremy Matthew Plunkett, San Jose, CA (US); William L. Schmidt, Los Gatos, CA (US); David T. Wang, San Jose, CA (US); Wael O. Zohni, San Jose, CA (US); Philip Arnold Ferolito, Sunnyvale, CA (US); Michael John Sebastian Smith, Palo Alto, CA (US); Suresh Natarajan Rajan, San Jose, CA (US); Joseph C. Fjelstad, Sunnyvale, CA (US)

(73) Assignee: Google Inc., Mountain View, CA (US)

( * ) Notice: Subject to any disclaimer, the term of this patent is extended or adjusted under 35 U.S.C. 154(b) by 686 days.

(21) Appl. No.: 11/855,826

(22) Filed: Sep. 14, 2007

(51) Int. Cl.
*H01L 23/34* (2006.01)
*H01L 23/48* (2006.01)
(52) U.S. Cl. .. 257/723; 723/780; 723/686; 723/E23.169
(58) Field of Classification Search .................. 257/723, 257/780, E23.169, 686
See application file for complete search history.

(56) References Cited

U.S. PATENT DOCUMENTS

| | | | |
|---|---|---|---|
| 3,800,292 A | 3/1974 | Curley et al. | |
| 4,069,452 A | 1/1978 | Conway et al. | |
| 4,323,965 A | 4/1982 | Johnson et al. | |
| 4,334,307 A | 6/1982 | Bourgeois et al. | |
| 4,345,319 A | 8/1982 | Bernardini et al. | |
| 4,392,212 A | 7/1983 | Miyasaka et al. | 365/230 |
| 4,525,921 A | 7/1985 | Carson et al. | 29/577 |
| 4,566,082 A | 1/1986 | Anderson | |
| 4,592,019 A | 5/1986 | Huang et al. | 365/78 |
| 4,646,128 A | 2/1987 | Carson et al. | 357/74 |
| 4,698,748 A | 10/1987 | Juzswik et al. | 364/200 |
| 4,706,166 A | 11/1987 | Go | 361/403 |
| 4,710,903 A | 12/1987 | Hereth et al. | 365/194 |
| 4,764,846 A | 8/1988 | Go | 361/388 |
| 4,780,843 A | 10/1988 | Tietjen | 364/900 |
| 4,794,597 A | 12/1988 | Ooba et al. | |

(Continued)

FOREIGN PATENT DOCUMENTS

DE 102004051345 5/2006

(Continued)

OTHER PUBLICATIONS

Final Rejection From U.S. Appl. No. 11/461,437 Mailed Nov. 10, 2009.

(Continued)

*Primary Examiner* — Nitin Parekh
(74) *Attorney, Agent, or Firm* — Fish & Richardson P.C.

(57) ABSTRACT

A system, method, and apparatus are included for providing additional space between an integrated circuit package and a circuit board. An integrated circuit package is provided including a plurality of integrated circuit package contacts. Also provided is a circuit board in electrical communication with the integrated circuit package. Further, the integrated circuit package, the integrated circuit contacts, and/or the circuit board is configured for providing additional space between the integrated circuit package and the circuit board to position at least a portion of at least one component between the integrated circuit package and the circuit board.

10 Claims, 16 Drawing Sheets

U.S. PATENT DOCUMENTS

| | | | | |
|---|---|---|---|---|
| 4,796,232 | A | 1/1989 | House | 365/189 |
| 4,841,440 | A | 6/1989 | Yonezu et al. | 364/200 |
| 4,862,347 | A | 8/1989 | Rudy | |
| 4,884,237 | A | 11/1989 | Mueller et al. | 365/63 |
| 4,887,240 | A | 12/1989 | Garverick et al. | 361/222 |
| 4,888,687 | A | 12/1989 | Allison et al. | |
| 4,899,107 | A | 2/1990 | Corbett et al. | 324/158 |
| 4,912,678 | A | 3/1990 | Mashiko | |
| 4,922,451 | A | 5/1990 | Lo et al. | |
| 4,935,734 | A | 6/1990 | Austin | 340/825.83 |
| 4,937,791 | A | 6/1990 | Steele et al. | |
| 4,956,694 | A | 9/1990 | Eide | |
| 4,982,265 | A | 1/1991 | Watanabe et al. | 357/75 |
| 4,983,533 | A | 1/1991 | Go | 437/7 |
| 5,025,364 | A | 6/1991 | Zellmer | |
| 5,072,424 | A | 12/1991 | Brent et al. | 365/189 |
| 5,083,266 | A | 1/1992 | Watanabe | 395/275 |
| 5,104,820 | A | 4/1992 | Go et al. | 437/51 |
| 5,193,072 | A | 3/1993 | Frenkil et al. | |
| 5,220,672 | A | 6/1993 | Nakao et al. | 395/750 |
| 5,241,266 | A | 8/1993 | Ahmad et al. | 324/158 |
| 5,252,807 | A | 10/1993 | Chizinsky | 219/390 |
| 5,257,233 | A | 10/1993 | Schaefer | 365/227 |
| 5,278,796 | A | 1/1994 | Tillinghast et al. | 365/211 |
| 5,282,177 | A | 1/1994 | McLaury | 365/230 |
| 5,332,922 | A | 7/1994 | Oguchi et al. | 257/723 |
| 5,347,428 | A | 9/1994 | Carson et al. | 361/760 |
| 5,384,745 | A | 1/1995 | Konishi et al. | 365/230.03 |
| 5,388,265 | A | 2/1995 | Volk | 395/750 |
| 5,390,334 | A | 2/1995 | Harrison | |
| 5,408,190 | A | 4/1995 | Wood et al. | 324/765 |
| 5,432,729 | A | 7/1995 | Carson et al. | 365/63 |
| 5,448,511 | A | 9/1995 | Paurus et al. | 365/52 |
| 5,453,434 | A | 9/1995 | Albaugh et al. | 514/397 |
| 5,467,455 | A | 11/1995 | Gay et al. | 395/281 |
| 5,483,497 | A | 1/1996 | Mochizuki et al. | |
| 5,498,886 | A | 3/1996 | Hsu et al. | 257/213 |
| 5,502,333 | A | 3/1996 | Bertin et al. | |
| 5,502,667 | A | 3/1996 | Bertin et al. | 365/51 |
| 5,513,135 | A | 4/1996 | Dell et al. | |
| 5,513,339 | A | 4/1996 | Agrawal et al. | |
| 5,519,832 | A | 5/1996 | Warchol | |
| 5,526,320 | A | 6/1996 | Zagar et al. | 365/233 |
| 5,530,836 | A | 6/1996 | Busch et al. | 395/477 |
| 5,550,781 | A | 8/1996 | Sugawara et al. | |
| 5,559,990 | A | 9/1996 | Cheng et al. | 395/484 |
| 5,561,622 | A | 10/1996 | Bertin et al. | 365/51 |
| 5,563,086 | A | 10/1996 | Bertin et al. | 437/52 |
| 5,566,344 | A | 10/1996 | Hall et al. | 395/800 |
| 5,581,498 | A | 12/1996 | Ludwig et al. | 365/63 |
| 5,581,779 | A | 12/1996 | Hall et al. | 395/800 |
| 5,590,071 | A | 12/1996 | Kolor et al. | 365/149 |
| 5,598,376 | A | 1/1997 | Merritt et al. | 365/230 |
| 5,604,714 | A | 2/1997 | Manning et al. | 365/230 |
| 5,606,710 | A | 2/1997 | Hall et al. | 395/800 |
| 5,608,262 | A | 3/1997 | Degani et al. | 257/723 |
| 5,610,864 | A | 3/1997 | Manning | 365/193 |
| 5,623,686 | A | 4/1997 | Hall et al. | 395/800 |
| 5,627,791 | A | 5/1997 | Wright et al. | 365/222 |
| 5,640,337 | A | 6/1997 | Huang et al. | 364/578 |
| 5,640,364 | A | 6/1997 | Merritt et al. | 365/233 |
| 5,652,724 | A | 7/1997 | Manning | 365/189 |
| 5,654,204 | A | 8/1997 | Anderson | 438/15 |
| 5,661,677 | A | 8/1997 | Rondeau et al. | 365/63 |
| 5,661,695 | A | 8/1997 | Zagar et al. | 365/233 |
| 5,668,773 | A | 9/1997 | Zagar et al. | 365/233 |
| 5,675,549 | A | 10/1997 | Ong et al. | 365/233 |
| 5,680,342 | A | 10/1997 | Frankeny | 365/52 |
| 5,682,354 | A | 10/1997 | Manning | 365/233 |
| 5,692,121 | A | 11/1997 | Bozso et al. | |
| 5,692,202 | A | 11/1997 | Kardach et al. | 395/750 |
| 5,696,732 | A | 12/1997 | Zagar et al. | 365/233 |
| 5,702,984 | A | 12/1997 | Bertin et al. | 437/208 |
| 5,703,813 | A | 12/1997 | Manning et al. | 365/189 |
| 5,706,247 | A | 1/1998 | Merritt et al. | 365/233 |
| RE35,733 | E | 2/1998 | Hernandez et al. | |
| 5,717,654 | A | 2/1998 | Manning | 365/233 |
| 5,721,859 | A | 2/1998 | Manning | 397/421 |
| 5,724,288 | A | 3/1998 | Cloud et al. | 365/193 |
| 5,729,503 | A | 3/1998 | Manning | 365/233 |
| 5,729,504 | A | 3/1998 | Cowles | 365/236 |
| 5,742,792 | A | 4/1998 | Yanai et al. | |
| 5,748,914 | A | 5/1998 | Barth et al. | 395/285 |
| 5,752,045 | A | 5/1998 | Chen | 395/750 |
| 5,757,703 | A | 5/1998 | Merritt et al. | 365/189 |
| 5,760,478 | A * | 6/1998 | Bozso et al. | 257/777 |
| 5,761,703 | A | 6/1998 | Bolyn | 711/106 |
| 5,781,766 | A | 7/1998 | Davis | 395/552 |
| 5,787,457 | A | 7/1998 | Miller et al. | |
| 5,798,961 | A | 8/1998 | Heyden et al. | 365/57 |
| 5,802,010 | A | 9/1998 | Zagar et al. | 365/233 |
| 5,802,395 | A | 9/1998 | Connolly et al. | |
| 5,802,555 | A | 9/1998 | Shigeeda | 711/106 |
| 5,812,488 | A | 9/1998 | Zagar et al. | 365/233 |
| 5,819,065 | A | 10/1998 | Chilton et al. | |
| 5,831,833 | A | 11/1998 | Shirakawa et al. | |
| 5,831,931 | A | 11/1998 | Manning | 365/233 |
| 5,831,932 | A | 11/1998 | Merritt et al. | 365/233 |
| 5,834,838 | A | 11/1998 | Anderson | 257/697 |
| 5,835,435 | A | 11/1998 | Bogin et al. | 365/22 |
| 5,838,165 | A | 11/1998 | Chatter | 326/38 |
| 5,838,177 | A | 11/1998 | Keeth | 327/108 |
| 5,841,580 | A | 11/1998 | Farmwald et al. | 365/194 |
| 5,843,799 | A | 12/1998 | Hsu et al. | 438/6 |
| 5,843,807 | A | 12/1998 | Burns | 438/109 |
| 5,845,108 | A | 12/1998 | Yoo et al. | 395/551 |
| 5,850,368 | A | 12/1998 | Ong et al. | 365/238 |
| 5,859,792 | A | 1/1999 | Rondeau et al. | 365/52 |
| 5,860,106 | A | 1/1999 | Domen et al. | 711/137 |
| 5,870,347 | A | 2/1999 | Keeth et al. | 365/230 |
| 5,870,350 | A | 2/1999 | Bertin et al. | |
| 5,872,907 | A | 2/1999 | Griess et al. | |
| 5,875,142 | A | 2/1999 | Chevallier | 365/212 |
| 5,878,279 | A | 3/1999 | Athenes | |
| 5,884,088 | A | 3/1999 | Kardach et al. | 395/750.06 |
| 5,901,105 | A | 5/1999 | Ong et al. | 365/230.06 |
| 5,903,500 | A | 5/1999 | Tsang et al. | 365/189.05 |
| 5,905,688 | A | 5/1999 | Park | 365/227 |
| 5,907,512 | A | 5/1999 | Parkinson et al. | 365/195 |
| 5,913,072 | A | 6/1999 | Wierenga | |
| 5,915,105 | A | 6/1999 | Farmwald et al. | 395/309 |
| 5,915,167 | A | 6/1999 | Leedy | |
| 5,917,758 | A | 6/1999 | Keeth | 365/189.05 |
| 5,923,611 | A | 7/1999 | Ryan | 365/233 |
| 5,924,111 | A | 7/1999 | Huang et al. | |
| 5,926,435 | A | 7/1999 | Park et al. | |
| 5,929,650 | A | 7/1999 | Pappert et al. | 324/763 |
| 5,943,254 | A | 8/1999 | Bakeman, Jr. et al. | 365/72 |
| 5,946,265 | A | 8/1999 | Cowles | 365/233 |
| 5,949,254 | A | 9/1999 | Keeth | 326/87 |
| 5,953,215 | A | 9/1999 | Karabatsos | 361/767 |
| 5,953,263 | A | 9/1999 | Farmwald et al. | 365/194 |
| 5,954,804 | A | 9/1999 | Farmwald et al. | 710/36 |
| 5,956,233 | A | 9/1999 | Yew et al. | 361/760 |
| 5,962,435 | A | 10/1999 | Mao et al. | 514/63 |
| 5,963,429 | A | 10/1999 | Chen | |
| 5,963,463 | A | 10/1999 | Rondeau et al. | 365/52 |
| 5,963,464 | A | 10/1999 | Dell et al. | 365/52 |
| 5,963,504 | A | 10/1999 | Manning | 365/233 |
| 5,966,724 | A | 10/1999 | Ryan | 711/105 |
| 5,966,727 | A | 10/1999 | Nishino | 711/127 |
| 5,969,996 | A | 10/1999 | Muranaka et al. | 365/189.01 |
| 5,973,392 | A * | 10/1999 | Senba et al. | 257/686 |
| 5,995,424 | A | 11/1999 | Lawrence et al. | |
| 5,995,443 | A | 11/1999 | Farmwald et al. | 365/233 |
| 6,001,671 | A | 12/1999 | Fjelstad | 438/112 |
| 6,002,613 | A | 12/1999 | Cloud et al. | 365/189 |
| 6,002,627 | A | 12/1999 | Chevallier | 365/212 |
| 6,014,339 | A | 1/2000 | Kobayashi et al. | 365/733 |
| 6,016,282 | A | 1/2000 | Keeth | 365/233 |
| 6,026,050 | A | 2/2000 | Baker et al. | 365/233 |
| 6,029,250 | A | 2/2000 | Keeth | 713/400 |
| 6,032,214 | A | 2/2000 | Farmwald et al. | 710/129 |
| 6,032,215 | A | 2/2000 | Farmwald et al. | 710/129 |
| 6,034,916 | A | 3/2000 | Lee | 365/233 |
| 6,034,918 | A | 3/2000 | Farmwald et al. | 365/233 |
| 6,035,365 | A | 3/2000 | Farmwald et al. | 710/129 |

| Patent | Kind | Date | Inventor | Class |
|---|---|---|---|---|
| 6,038,195 | A | 3/2000 | Farmwald et al. | 365/233 |
| 6,038,673 | A | 3/2000 | Benn et al. | 71/323 |
| 6,044,032 | A | 3/2000 | Li | 365/230 |
| 6,047,073 | A | 4/2000 | Norris et al. | |
| 6,047,344 | A | 4/2000 | Kawasumi et al. | 710/107 |
| 6,053,948 | A | 4/2000 | Vaidyanathan et al. | 703/14 |
| 6,058,451 | A | 5/2000 | Bermingham et al. | |
| 6,069,504 | A | 5/2000 | Keeth | 327/108 |
| 6,070,217 | A | 5/2000 | Connolly et al. | 710/131 |
| 6,073,223 | A | 6/2000 | McAllister et al. | 711/167 |
| 6,075,730 | A | 6/2000 | Barth et al. | 365/191 |
| 6,075,744 | A | 6/2000 | Tsern et al. | 365/230 |
| 6,078,546 | A | 6/2000 | Lee | 365/233 |
| 6,079,025 | A | 6/2000 | Fung | 713/323 |
| 6,084,434 | A | 7/2000 | Keeth | 326/87 |
| 6,088,290 | A | 7/2000 | Ohtake et al. | 365/233 |
| 6,091,251 | A | 7/2000 | Wood et al. | 324/755 |
| RE36,839 | E | 8/2000 | Simmons et al. | 326/93 |
| 6,101,152 | A | 8/2000 | Farmwald et al. | 365/233 |
| 6,101,564 | A | 8/2000 | Athenes et al. | |
| 6,101,612 | A | 8/2000 | Jeddeloh | 713/401 |
| 6,108,795 | A | 8/2000 | Jeddeloh | 713/401 |
| 6,111,812 | A | 8/2000 | Gans et al. | 365/233 |
| 6,134,638 | A | 10/2000 | Olarig et al. | 711/167 |
| 6,154,370 | A | 11/2000 | Degani et al. | 361/761 |
| 6,166,991 | A | 12/2000 | Phelan | 365/233 |
| 6,182,184 | B1 | 1/2001 | Farmwald et al. | 710/129 |
| 6,199,151 | B1 | 3/2001 | Williams et al. | |
| 6,208,168 | B1 | 3/2001 | Rhee | 326/83 |
| 6,216,246 | B1 | 4/2001 | Shau | 714/763 |
| 6,222,739 | B1 | 4/2001 | Bhakta et al. | 361/790 |
| 6,226,709 | B1 | 5/2001 | Goodwin et al. | |
| 6,233,192 | B1 | 5/2001 | Tanaka | 365/222 |
| 6,233,650 | B1 | 5/2001 | Johnson et al. | |
| 6,240,048 | B1 | 5/2001 | Matsubara | 365/233 |
| 6,243,282 | B1 | 6/2001 | Rondeau et al. | 365/52 |
| 6,252,807 | B1 | 6/2001 | Suzuki et al. | |
| 6,260,097 | B1 | 7/2001 | Farmwald et al. | 710/129 |
| 6,260,154 | B1 | 7/2001 | Jeddeloh | 713/401 |
| 6,262,938 | B1 | 7/2001 | Lee et al. | 365/233 |
| 6,266,285 | B1 | 7/2001 | Farmwald et al. | 365/194 |
| 6,266,292 | B1 | 7/2001 | Tsern et al. | 365/230 |
| 6,274,395 | B1 | 8/2001 | Weber | 438/14 |
| 6,279,069 | B1 | 8/2001 | Robinson et al. | 711/103 |
| 6,295,572 | B1 | 9/2001 | Wu | 710/131 |
| 6,298,426 | B1 | 10/2001 | Ajanovic | 711/172 |
| 6,304,511 | B1 | 10/2001 | Gans et al. | 365/233 |
| 6,307,769 | B1 | 10/2001 | Nuxoll et al. | 365/63 |
| 6,314,051 | B1 | 11/2001 | Farmwald et al. | 365/233 |
| 6,317,352 | B1 | 11/2001 | Halbert et al. | 365/52 |
| 6,317,381 | B1 | 11/2001 | Gans et al. | 365/233 |
| 6,324,120 | B2 | 11/2001 | Farmwald et al. | 365/233 |
| 6,326,810 | B1 | 12/2001 | Keeth | 326/83 |
| 6,327,664 | B1 | 12/2001 | Dell et al. | 713/323 |
| 6,336,174 | B1 | 1/2002 | Li et al. | |
| 6,338,108 | B1 | 1/2002 | Motomura | 710/110 |
| 6,338,113 | B1 | 1/2002 | Kubo et al. | 711/105 |
| 6,341,347 | B1 | 1/2002 | Joy et al. | 712/228 |
| 6,343,019 | B1 * | 1/2002 | Jiang et al. | 361/761 |
| 6,343,042 | B1 | 1/2002 | Tsern et al. | 365/222 |
| 6,353,561 | B1 | 3/2002 | Funyu et al. | 365/195 |
| 6,356,105 | B1 | 3/2002 | Volk | 326/30 |
| 6,356,500 | B1 | 3/2002 | Cloud et al. | 365/226 |
| 6,362,656 | B2 | 3/2002 | Rhee | 326/87 |
| 6,363,031 | B2 | 3/2002 | Phelan | 365/733 |
| 6,378,020 | B2 | 4/2002 | Farmwald et al. | 710/129 |
| 6,381,188 | B1 | 4/2002 | Choi et al. | 365/222 |
| 6,381,668 | B1 | 4/2002 | Lunteren | 711/5 |
| 6,389,514 | B1 | 5/2002 | Rokicki | |
| 6,392,304 | B1 | 5/2002 | Butler | 257/777 |
| 6,414,868 | B1 | 7/2002 | Wong et al. | 365/51 |
| 6,418,034 | B1 | 7/2002 | Weber et al. | 361/790 |
| 6,421,754 | B1 | 7/2002 | Kau et al. | |
| 6,424,532 | B2 | 7/2002 | Kawamura | |
| 6,426,916 | B2 | 7/2002 | Farmwald et al. | 365/233 |
| 6,429,029 | B1 | 8/2002 | Eldridge et al. | 438/14 |
| 6,430,103 | B2 | 8/2002 | Nakayama et al. | 365/230.03 |
| 6,437,600 | B1 | 8/2002 | Keeth | 326/86 |
| 6,438,057 | B1 | 8/2002 | Ruckerbauer | |
| 6,442,698 | B2 | 8/2002 | Nizar | 713/320 |
| 6,445,591 | B1 | 9/2002 | Kwong | |
| 6,452,826 | B1 | 9/2002 | Kim et al. | 365/51 |
| 6,452,863 | B2 | 9/2002 | Farmwald et al. | 365/233 |
| 6,453,400 | B1 | 9/2002 | Maesako et al. | 711/320 |
| 6,453,402 | B1 | 9/2002 | Jeddeloh | 711/167 |
| 6,453,434 | B2 | 9/2002 | Delp et al. | |
| 6,455,348 | B1 | 9/2002 | Yamaguchi | |
| 6,457,095 | B1 | 9/2002 | Volk | 711/105 |
| 6,459,651 | B1 | 10/2002 | Lee et al. | 365/233 |
| 6,473,831 | B1 | 10/2002 | Schade | 711/115 |
| 6,476,476 | B1 * | 11/2002 | Glenn | 257/686 |
| 6,480,929 | B1 | 11/2002 | Gauthier et al. | 711/105 |
| 6,487,102 | B1 | 11/2002 | Halbert et al. | 365/51 |
| 6,489,669 | B2 | 12/2002 | Shimada et al. | 257/686 |
| 6,490,161 | B1 | 12/2002 | Johnson | |
| 6,492,726 | B1 * | 12/2002 | Quek et al. | 257/723 |
| 6,493,789 | B2 | 12/2002 | Ware et al. | 711/105 |
| 6,496,440 | B2 | 12/2002 | Manning | 365/230.03 |
| 6,496,897 | B2 | 12/2002 | Ware et al. | 711/105 |
| 6,498,766 | B2 | 12/2002 | Lee et al. | 365/233 |
| 6,510,097 | B2 | 1/2003 | Fukuyama | 365/230.03 |
| 6,510,503 | B2 | 1/2003 | Gillingham et al. | 711/167 |
| 6,512,392 | B2 | 1/2003 | Fleury et al. | 324/765 |
| 6,521,984 | B2 | 2/2003 | Matsuura | 257/768 |
| 6,526,471 | B1 | 2/2003 | Shimomura et al. | 711/5 |
| 6,526,473 | B1 | 2/2003 | Kim | |
| 6,526,484 | B1 | 2/2003 | Stacovsky et al. | 711/158 |
| 6,545,895 | B1 | 4/2003 | Li et al. | 365/52 |
| 6,546,446 | B2 | 4/2003 | Farmwald et al. | 710/305 |
| 6,553,450 | B1 | 4/2003 | Dodd et al. | 711/105 |
| 6,560,158 | B2 | 5/2003 | Choi et al. | 365/226 |
| 6,563,337 | B2 | 5/2003 | Dour | 326/30 |
| 6,563,759 | B2 | 5/2003 | Yahata et al. | 365/233 |
| 6,564,281 | B2 | 5/2003 | Farmwald et al. | 710/305 |
| 6,564,285 | B1 | 5/2003 | Mills et al. | 711/103 |
| 6,574,150 | B2 | 6/2003 | Suyama et al. | 365/189.05 |
| 6,584,037 | B2 | 6/2003 | Farmwald et al. | 365/233 |
| 6,587,912 | B2 | 7/2003 | Leddige et al. | 711/5 |
| 6,590,822 | B2 | 7/2003 | Hwang et al. | 365/222 |
| 6,594,770 | B1 | 7/2003 | Sato et al. | 713/320 |
| 6,597,616 | B2 | 7/2003 | Tsern et al. | 365/222 |
| 6,597,617 | B2 | 7/2003 | Ooishi et al. | 365/222 |
| 6,614,700 | B2 | 9/2003 | Dietrich et al. | 365/194 |
| 6,618,267 | B1 | 9/2003 | Dalal et al. | |
| 6,618,791 | B1 | 9/2003 | Dodd et al. | 711/105 |
| 6,621,760 | B1 | 9/2003 | Ahmad et al. | 365/233 |
| 6,630,729 | B2 | 10/2003 | Huang | 257/676 |
| 6,631,086 | B1 | 10/2003 | Bill et al. | 365/185.09 |
| 6,639,820 | B1 | 10/2003 | Khandekar et al. | 365/63 |
| 6,646,939 | B2 | 11/2003 | Kwak | 365/219 |
| 6,650,588 | B2 | 11/2003 | Yamagata | 365/222 |
| 6,650,594 | B1 | 11/2003 | Lee et al. | 365/233 |
| 6,657,634 | B1 | 12/2003 | Sinclair et al. | 345/534 |
| 6,657,918 | B2 | 12/2003 | Foss et al. | 365/233 |
| 6,657,919 | B2 | 12/2003 | Foss et al. | 365/233 |
| 6,658,016 | B1 | 12/2003 | Dai et al. | |
| 6,658,530 | B1 | 12/2003 | Robertson et al. | 711/115 |
| 6,659,512 | B1 * | 12/2003 | Harper et al. | 257/777 |
| 6,664,625 | B2 | 12/2003 | Hiruma | |
| 6,665,224 | B1 | 12/2003 | Lehmann et al. | 365/222 |
| 6,665,227 | B2 | 12/2003 | Fetzer | 365/229 |
| 6,668,242 | B1 | 12/2003 | Reynov et al. | |
| 6,674,154 | B2 | 1/2004 | Minamio et al. | |
| 6,683,372 | B1 | 1/2004 | Wong et al. | 257/686 |
| 6,684,292 | B2 | 1/2004 | Piccirillo et al. | |
| 6,690,191 | B2 | 2/2004 | Wu et al. | |
| 6,697,295 | B2 | 2/2004 | Farmwald et al. | 365/233 |
| 6,701,446 | B2 | 3/2004 | Tsern et al. | 713/501 |
| 6,705,877 | B1 | 3/2004 | Li et al. | 439/74 |
| 6,708,144 | B1 | 3/2004 | Merryman et al. | 703/14 |
| 6,710,430 | B2 | 3/2004 | Minamio et al. | |
| 6,711,043 | B2 | 3/2004 | Friedman et al. | |
| 6,713,856 | B2 | 3/2004 | Tsai et al. | |
| 6,714,891 | B2 | 3/2004 | Dendinger | 702/132 |
| 6,724,684 | B2 | 4/2004 | Kim | 365/233 |
| 6,730,540 | B2 * | 5/2004 | Siniaguine | 438/107 |
| 6,731,009 | B1 * | 5/2004 | Jones et al. | 257/777 |
| 6,731,527 | B2 | 5/2004 | Brown | 365/63 |

| | | |
|---|---|---|
| 6,742,098 B1 | 5/2004 | Halbert et al. |
| 6,744,687 B2 | 6/2004 | Koo et al. .................... 365/226 |
| 6,747,887 B2 | 6/2004 | Halbert et al. |
| 6,751,113 B2 | 6/2004 | Bhakta et al. ................. 365/63 |
| 6,751,696 B2 | 6/2004 | Farmwald et al. ............ 710/305 |
| 6,754,129 B2 | 6/2004 | Khateri et al. ................ 365/226 |
| 6,754,132 B2 | 6/2004 | Kyung ........................ 365/233 |
| 6,757,751 B1 | 6/2004 | Gene ............................ 710/36 |
| 6,762,948 B2 | 7/2004 | Kyun et al. .................... 365/51 |
| 6,765,812 B2 | 7/2004 | Anderson ...................... 365/51 |
| 6,766,469 B2 | 7/2004 | Larson et al. |
| 6,771,526 B2 | 8/2004 | LaBerge ........................ 365/63 |
| 6,772,359 B2 | 8/2004 | Kwak et al. ................... 713/500 |
| 6,779,097 B2 | 8/2004 | Gillingham et al. ........... 711/167 |
| 6,785,767 B2 | 8/2004 | Coulson ....................... 711/112 |
| 6,791,877 B2 | 9/2004 | Miura et al. .................. 365/185 |
| 6,795,899 B2 | 9/2004 | Dodd et al. .................... 711/137 |
| 6,799,241 B2 | 9/2004 | Kahn et al. .................... 711/105 |
| 6,801,989 B2 | 10/2004 | Johnson et al. ............... 711/167 |
| 6,807,598 B2 | 10/2004 | Farmwald et al. ............ 710/305 |
| 6,807,655 B1 | 10/2004 | Rehani et al. .................... 716/4 |
| 6,816,991 B2 | 11/2004 | Sanghani ........................ 714/733 |
| 6,819,602 B2 | 11/2004 | Seo et al. ........................ 365/193 |
| 6,819,617 B2 | 11/2004 | Hwang et al. ................. 365/222 |
| 6,820,163 B1 | 11/2004 | McCall et al. ................. 710/310 |
| 6,820,169 B2 | 11/2004 | Wilcox et al. ................. 711/105 |
| 6,826,104 B2 | 11/2004 | Kawaguchi et al. ........... 365/222 |
| 6,839,290 B2 | 1/2005 | Ahmad et al. ................. 365/193 |
| 6,845,027 B2 | 1/2005 | Mayer et al. |
| 6,845,055 B1 | 1/2005 | Koga et al. .................... 365/229 |
| 6,847,582 B2 | 1/2005 | Pan ................................ 365/233 |
| 6,850,449 B2 | 2/2005 | Takahashi ...................... 365/222 |
| 6,862,202 B2 | 3/2005 | Schaefer ........................ 365/52 |
| 6,862,249 B2 | 3/2005 | Kyung ........................... 365/233 |
| 6,862,653 B1 | 3/2005 | Dodd et al. .................... 711/105 |
| 6,873,534 B2 | 3/2005 | Bhakta et al. .................. 365/63 |
| 6,878,570 B2 | 4/2005 | Lyu et al. ........................ 438/106 |
| 6,894,933 B2 | 5/2005 | Kuzmenka et al. ....... 365/189.05 |
| 6,898,683 B2 | 5/2005 | Nakamura .................... 711/167 |
| 6,908,314 B2 | 6/2005 | Brown ............................ 439/68 |
| 6,912,778 B2 | 7/2005 | Ahn et al. ........................ 29/852 |
| 6,914,786 B1 | 7/2005 | Paulsen et al. |
| 6,917,219 B2 | 7/2005 | New ................................ 326/41 |
| 6,922,371 B2 | 7/2005 | Takahashi et al. ............. 365/227 |
| 6,930,900 B2 | 8/2005 | Bhakta et al. .................. 365/51 |
| 6,930,903 B2 | 8/2005 | Bhakta et al. .................. 365/63 |
| 6,938,119 B2 | 8/2005 | Kohn et al. .................... 711/105 |
| 6,943,450 B2 | 9/2005 | Fee et al. ....................... 257/773 |
| 6,944,748 B2 | 9/2005 | Sanches et al. |
| 6,947,341 B2 | 9/2005 | Stubbs et al. |
| 6,951,982 B2 | 10/2005 | Chye et al. ..................... 174/52 |
| 6,952,794 B2 | 10/2005 | Lu |
| 6,961,281 B2 | 11/2005 | Wong et al. ............... 365/230.03 |
| 6,968,416 B2 | 11/2005 | Moy ............................. 710/310 |
| 6,968,419 B1 | 11/2005 | Holman ............................ 711/5 |
| 6,970,968 B1 | 11/2005 | Holman ............................ 711/5 |
| 6,980,021 B1 | 12/2005 | Srivastava et al. ............. 326/30 |
| 6,986,118 B2 | 1/2006 | Dickman ........................ 716/8 |
| 6,992,501 B2 | 1/2006 | Rapport ........................ 326/30 |
| 6,992,950 B2 | 1/2006 | Foss et al. ..................... 365/233 |
| 7,000,062 B2 | 2/2006 | Perego et al. .................... 711/5 |
| 7,003,618 B2 | 2/2006 | Perego et al. .................... 711/5 |
| 7,003,639 B2 | 2/2006 | Tsern et al. .................... 711/154 |
| 7,007,095 B2 | 2/2006 | Chen et al. |
| 7,007,175 B2 | 2/2006 | Chang et al. ................. 713/300 |
| 7,010,642 B2 | 3/2006 | Perego et al. .................... 711/5 |
| 7,010,736 B1 | 3/2006 | Teh et al. ....................... 714/733 |
| 7,024,518 B2 | 4/2006 | Halbert et al. ................. 711/115 |
| 7,026,708 B2 | 4/2006 | Cady et al. .................... 257/686 |
| 7,028,215 B2 | 4/2006 | Depew et al. |
| 7,028,234 B2 | 4/2006 | Huckaby et al. .............. 714/710 |
| 7,033,861 B1 | 4/2006 | Partridge et al. .............. 438/109 |
| 7,035,150 B2 | 4/2006 | Streif et al. .................... 365/194 |
| 7,043,599 B1 | 5/2006 | Ware et al. .................... 711/106 |
| 7,043,611 B2 | 5/2006 | McClannahan et al. |
| 7,045,396 B2 | 5/2006 | Crowley et al. ............... 438/123 |
| 7,045,901 B2 | 5/2006 | Lin et al. ....................... 257/778 |
| 7,046,538 B2 | 5/2006 | Kinsley et al. ................. 365/52 |
| 7,053,470 B1 | 5/2006 | Sellers et al. ................. 257/768 |
| 7,053,478 B2 | 5/2006 | Roper et al. ................... 257/686 |
| 7,058,776 B2 | 6/2006 | Lee ................................ 711/167 |
| 7,058,863 B2 | 6/2006 | Kouchi et al. ................. 714/718 |
| 7,061,784 B2 | 6/2006 | Jakobs et al. .................... 365/51 |
| 7,061,823 B2 | 6/2006 | Faue et al. ................ 365/230.08 |
| 7,066,741 B2 | 6/2006 | Burns et al. ..................... 439/69 |
| 7,075,175 B2 | 7/2006 | Kazi et al. ..................... 257/678 |
| 7,079,396 B2 | 7/2006 | Gates et al. |
| 7,079,441 B1 | 7/2006 | Partsch et al. ................. 365/226 |
| 7,079,446 B2 | 7/2006 | Murtagh et al. ............... 365/233 |
| 7,085,152 B2 | 8/2006 | Ellis et al. ..................... 365/149 |
| 7,085,941 B2 | 8/2006 | Li .................................. 713/300 |
| 7,089,438 B2 | 8/2006 | Raad ............................. 713/322 |
| 7,093,101 B2 | 8/2006 | Aasheim et al. .............. 711/207 |
| 7,103,730 B2 | 9/2006 | Saxena et al. ................. 711/156 |
| 7,119,428 B2 | 10/2006 | Tanie et al. |
| 7,120,727 B2 | 10/2006 | Lee et al. .......................... 711/5 |
| 7,126,399 B1 | 10/2006 | Lee .................................. 7/261 |
| 7,127,567 B2 | 10/2006 | Ramakrishnan et al. |
| 7,133,960 B1 | 11/2006 | Thompson et al. ............... 711/5 |
| 7,136,978 B2 | 11/2006 | Miura et al. ................... 711/165 |
| 7,149,145 B2 | 12/2006 | Kim et al. ..................... 365/233 |
| 7,149,824 B2 | 12/2006 | Johnson ........................ 710/35 |
| 7,173,863 B2 | 2/2007 | Conley et al. ................. 365/189 |
| 7,200,021 B2 | 4/2007 | Raghuram ..................... 365/51 |
| 7,205,789 B1 | 4/2007 | Karabatsos ..................... 326/30 |
| 7,210,059 B2 | 4/2007 | Jeddeloh |
| 7,215,561 B2 | 5/2007 | Park et al. |
| 7,218,566 B1 | 5/2007 | Totolos, Jr. et al. |
| 7,224,595 B2 | 5/2007 | Dreps et al. .................... 365/63 |
| 7,228,264 B2 | 6/2007 | Barrenscheen et al. ........ 703/23 |
| 7,231,562 B2 | 6/2007 | Ohlhoff et al. |
| 7,233,541 B2 | 6/2007 | Yamamoto et al. ...... 365/230.03 |
| 7,234,081 B2 | 6/2007 | Nguyen et al. |
| 7,243,185 B2 | 7/2007 | See et al. |
| 7,245,541 B2 | 7/2007 | Janzen .......................... 365/198 |
| 7,254,036 B2 | 8/2007 | Pauley et al. ................. 361/721 |
| 7,266,639 B2 | 9/2007 | Raghuram ..................... 711/115 |
| 7,269,042 B2 | 9/2007 | Kinsley et al. ................. 365/52 |
| 7,269,708 B2 | 9/2007 | Ware ............................. 711/203 |
| 7,274,583 B2 | 9/2007 | Park et al. |
| 7,277,333 B2 | 10/2007 | Schaefer |
| 7,286,436 B2 | 10/2007 | Bhakta et al. ................. 365/230 |
| 7,289,386 B2 | 10/2007 | Bhakta et al. ................. 365/230 |
| 7,296,754 B2 | 11/2007 | Nishizawa et al. ............ 235/492 |
| 7,299,330 B2 | 11/2007 | Gillingham et al. ........... 711/167 |
| 7,302,598 B2 | 11/2007 | Suzuki et al. |
| 7,307,863 B2 | 12/2007 | Yen et al. ........................ 365/63 |
| 7,317,250 B2 | 1/2008 | Koh et al. |
| 7,363,422 B2 | 4/2008 | Perego et al. ................. 711/105 |
| 7,366,947 B2 | 4/2008 | Gower et al. |
| 7,379,316 B2 | 5/2008 | Rajan .............................. 365/63 |
| 7,386,656 B2 | 6/2008 | Rajan et al. ................... 711/103 |
| 7,392,338 B2 | 6/2008 | Rajan et al. ................... 711/103 |
| 7,408,393 B1 | 8/2008 | Jain et al. ..................... 327/202 |
| 7,409,492 B2 | 8/2008 | Tanaka et al. ................. 711/103 |
| 7,414,917 B2 | 8/2008 | Ruckerbauer et al. |
| 7,428,644 B2 | 9/2008 | Jeddeloh et al. |
| 7,437,579 B2 | 10/2008 | Jeddeloh et al. ............... 713/300 |
| 7,441,064 B2 | 10/2008 | Gaskins |
| 7,457,122 B2 | 11/2008 | Lai et al. |
| 7,464,225 B2 | 12/2008 | Tsern ............................ 711/115 |
| 7,472,220 B2 | 12/2008 | Rajan et al. ................... 711/103 |
| 7,474,576 B2 | 1/2009 | Co et al. |
| 7,480,147 B2 | 1/2009 | Hoss et al. |
| 7,480,774 B2 | 1/2009 | Ellis et al. |
| 7,496,777 B2 | 2/2009 | Kapil ............................. 713/324 |
| 7,515,453 B2 | 4/2009 | Rajan .............................. 365/63 |
| 7,532,537 B2 | 5/2009 | Solomon et al. .............. 365/230 |
| 7,539,800 B2 | 5/2009 | Dell et al. |
| 7,573,136 B2 | 8/2009 | Jiang et al. |
| 7,580,312 B2 | 8/2009 | Rajan et al. |
| 7,581,121 B2 | 8/2009 | Barth et al. |
| 7,581,127 B2 | 8/2009 | Rajan et al. |
| 7,590,796 B2 | 9/2009 | Rajan et al. |
| 7,599,205 B2 | 10/2009 | Rajan |
| 7,606,245 B2 | 10/2009 | Ma et al. |
| 7,609,567 B2 | 10/2009 | Rajan et al. |
| 7,613,880 B2 | 11/2009 | Miura et al. |

| | | |
|---|---|---|
| 7,619,912 B2 | 11/2009 | Bhakta et al. |
| 7,724,589 B2 | 5/2010 | Rajan et al. |
| 7,730,338 B2 | 6/2010 | Rajan et al. |
| 7,761,724 B2 | 7/2010 | Rajan et al. |
| 2001/0000822 A1 | 5/2001 | Dell et al. .................. 711/170 |
| 2001/0003198 A1 | 6/2001 | Wu |
| 2001/0011322 A1 | 8/2001 | Stolt et al. |
| 2001/0019509 A1 | 9/2001 | Aho et al. |
| 2001/0021106 A1 | 9/2001 | Weber et al. ................. 361/790 |
| 2001/0021137 A1 | 9/2001 | Kai et al. .................... 365/222 |
| 2001/0046129 A1 | 11/2001 | Broglia et al. |
| 2001/0046163 A1 | 11/2001 | Yanagawa |
| 2002/0002662 A1 | 1/2002 | Olarig et al. |
| 2002/0004897 A1 | 1/2002 | Kao et al. |
| 2002/0015340 A1 | 2/2002 | Batinovich |
| 2002/0019961 A1 | 2/2002 | Blodgett ..................... 714/718 |
| 2002/0034068 A1 | 3/2002 | Weber et al. ................. 361/790 |
| 2002/0038405 A1 | 3/2002 | Leddige et al. .............. 711/115 |
| 2002/0041507 A1 | 4/2002 | Woo et al. .................... 365/51 |
| 2002/0051398 A1 | 5/2002 | Mizugaki .................... 365/222 |
| 2002/0060945 A1 | 5/2002 | Ikeda |
| 2002/0064073 A1 | 5/2002 | Chien ........................ 365/200 |
| 2002/0064083 A1 | 5/2002 | Ryu et al. ................... 365/233 |
| 2002/0089831 A1 | 7/2002 | Forthun ...................... 361/760 |
| 2002/0089970 A1 | 7/2002 | Asada et al. |
| 2002/0094671 A1 | 7/2002 | Distefano et al. |
| 2002/0121650 A1 | 9/2002 | Minamio et al. |
| 2002/0121670 A1 | 9/2002 | Minamio et al. |
| 2002/0124195 A1 | 9/2002 | Nizar ......................... 713/320 |
| 2002/0129204 A1 | 9/2002 | Leighnor et al. |
| 2002/0145900 A1 | 10/2002 | Schaefer ....................... 365/52 |
| 2002/0165706 A1 | 11/2002 | Raynham ...................... 703/25 |
| 2002/0167092 A1 | 11/2002 | Fee et al. |
| 2002/0172024 A1 | 11/2002 | Hui et al. |
| 2002/0174274 A1 | 11/2002 | Wu et al. ..................... 710/100 |
| 2002/0184438 A1 | 12/2002 | Usui ........................... 711/106 |
| 2003/0002262 A1 | 1/2003 | Benisek et al. .............. 361/728 |
| 2003/0011993 A1 | 1/2003 | Summers et al. |
| 2003/0016550 A1 | 1/2003 | Yoo et al. |
| 2003/0021175 A1 | 1/2003 | Tae Kwak ................... 365/219 |
| 2003/0026155 A1 | 2/2003 | Yamagata |
| 2003/0026159 A1 | 2/2003 | Frankowsky et al. |
| 2003/0035312 A1 | 2/2003 | Halbert et al. ................. 365/51 |
| 2003/0039158 A1 | 2/2003 | Horiguchi et al. ........... 365/200 |
| 2003/0041295 A1 | 2/2003 | Hou et al. |
| 2003/0061458 A1 | 3/2003 | Wilcox et al. ............... 711/167 |
| 2003/0061459 A1 | 3/2003 | Aboulenein et al. |
| 2003/0083855 A1 | 5/2003 | Fukuyama |
| 2003/0093614 A1 | 5/2003 | Kohn et al. .................. 711/105 |
| 2003/0101392 A1 | 5/2003 | Lee ............................. 714/718 |
| 2003/0105932 A1 | 6/2003 | David et al. .................. 711/167 |
| 2003/0117875 A1 | 6/2003 | Lee et al. .................... 365/226 |
| 2003/0123389 A1 | 7/2003 | Russell et al. |
| 2003/0126338 A1 | 7/2003 | Dodd et al. .................. 710/305 |
| 2003/0127737 A1 | 7/2003 | Takahashi |
| 2003/0131160 A1 | 7/2003 | Hampel et al. ................ 710/22 |
| 2003/0145163 A1 | 7/2003 | Seo et al. ..................... 711/105 |
| 2003/0158995 A1 | 8/2003 | Lee et al. ..................... 711/105 |
| 2003/0164539 A1 | 9/2003 | Yau ............................. 257/686 |
| 2003/0164543 A1 | 9/2003 | Kheng Lee |
| 2003/0182513 A1 | 9/2003 | Dodd et al. .................. 711/137 |
| 2003/0183934 A1 | 10/2003 | Barrett ......................... 257/738 |
| 2003/0189868 A1 | 10/2003 | Riesenman et al. .......... 365/226 |
| 2003/0189870 A1 | 10/2003 | Wilcox ....................... 365/233 |
| 2003/0191888 A1 | 10/2003 | Klein .......................... 711/105 |
| 2003/0191915 A1 | 10/2003 | Saxena et al. ................ 711/160 |
| 2003/0200382 A1 | 10/2003 | Wells et al. .................. 711/106 |
| 2003/0200474 A1 | 10/2003 | Li ................................ 713/320 |
| 2003/0205802 A1 | 11/2003 | Segaram ...................... 257/690 |
| 2003/0206476 A1 | 11/2003 | Joo ............................. 365/222 |
| 2003/0217303 A1 | 11/2003 | Chua-Eoan et al. .......... 713/600 |
| 2003/0223290 A1 | 12/2003 | Park et al. |
| 2003/0227798 A1 | 12/2003 | Pax ........................ 365/189.12 |
| 2003/0229821 A1 | 12/2003 | Ma ................................ 714/8 |
| 2003/0230801 A1 | 12/2003 | Jiang et al. |
| 2003/0231540 A1 | 12/2003 | Lazar et al. .................. 365/222 |
| 2003/0231542 A1 | 12/2003 | Zaharinova-Papazova et al. ............................ 365/226 |
| 2004/0016994 A1 | 1/2004 | Huang |
| 2004/0027902 A1 | 2/2004 | Ooishi et al. ................. 365/222 |
| 2004/0034732 A1 | 2/2004 | Valin et al. ...................... 711/4 |
| 2004/0034755 A1 | 2/2004 | LaBerge et al. |
| 2004/0037133 A1 | 2/2004 | Park et al. .................... 365/202 |
| 2004/0044808 A1 | 3/2004 | Salmon et al. ................... 710/8 |
| 2004/0047228 A1 | 3/2004 | Chen .......................... 365/232 |
| 2004/0057317 A1 | 3/2004 | Schaefer ..................... 365/222 |
| 2004/0064647 A1 | 4/2004 | DeWhitt et al. .............. 711/135 |
| 2004/0064767 A1 | 4/2004 | Huckaby et al. ............. 714/710 |
| 2004/0083324 A1 | 4/2004 | Rabinovitz et al. |
| 2004/0088475 A1 | 5/2004 | Streif et al. .................. 711/105 |
| 2004/0100837 A1 | 5/2004 | Lee |
| 2004/0117723 A1 | 6/2004 | Foss ........................... 714/805 |
| 2004/0123173 A1 | 6/2004 | Emberling et al. ........... 714/733 |
| 2004/0125635 A1 | 7/2004 | Kuzmenka ..................... 365/51 |
| 2004/0133736 A1 | 7/2004 | Kyung ........................ 711/105 |
| 2004/0139359 A1 | 7/2004 | Samson et al. ............... 713/320 |
| 2004/0145963 A1 | 7/2004 | Byon .......................... 365/233 |
| 2004/0151038 A1 | 8/2004 | Ruckerbauer et al. ........ 365/200 |
| 2004/0174765 A1 | 9/2004 | Seo et al. .................... 365/233 |
| 2004/0177079 A1 | 9/2004 | Gluhovsky et al. .......... 707/100 |
| 2004/0178824 A1 | 9/2004 | Pan ............................... 326/93 |
| 2004/0184324 A1 | 9/2004 | Pax ........................ 365/189.12 |
| 2004/0186956 A1 | 9/2004 | Perego et al. ................. 711/115 |
| 2004/0188704 A1 | 9/2004 | Halbert et al. ............... 257/145 |
| 2004/0195682 A1* | 10/2004 | Kimura ....................... 257/723 |
| 2004/0196732 A1 | 10/2004 | Lee ............................. 365/233 |
| 2004/0205433 A1 | 10/2004 | Gower et al. |
| 2004/0208173 A1 | 10/2004 | Di Gregorio ................ 370/360 |
| 2004/0225858 A1 | 11/2004 | Brueggen |
| 2004/0228166 A1 | 11/2004 | Braun et al. ................. 365/154 |
| 2004/0228196 A1 | 11/2004 | Kwak et al. |
| 2004/0228203 A1 | 11/2004 | Koo ............................ 365/133 |
| 2004/0230932 A1 | 11/2004 | Dickmann .................... 716/10 |
| 2004/0236877 A1 | 11/2004 | Burton |
| 2004/0250989 A1 | 12/2004 | Im et al. |
| 2004/0256638 A1 | 12/2004 | Perego et al. ................. 257/200 |
| 2004/0257847 A1 | 12/2004 | Matsui et al. .................. 365/63 |
| 2004/0260957 A1 | 12/2004 | Jeddeloh et al. ............. 713/300 |
| 2004/0264255 A1 | 12/2004 | Royer ..................... 365/189.01 |
| 2004/0268161 A1 | 12/2004 | Ross .......................... 713/300 |
| 2005/0018495 A1 | 1/2005 | Bhakta et al. .................. 365/19 |
| 2005/0021874 A1 | 1/2005 | Georgiou et al. ............ 709/250 |
| 2005/0024963 A1 | 2/2005 | Jakobs et al. ................ 365/202 |
| 2005/0027928 A1 | 2/2005 | Avraham et al. ............. 711/103 |
| 2005/0028038 A1 | 2/2005 | Pomaranski et al. ........... 714/42 |
| 2005/0034004 A1 | 2/2005 | Bunker et al. |
| 2005/0036350 A1 | 2/2005 | So et al. ........................ 365/63 |
| 2005/0041504 A1 | 2/2005 | Perego et al. ................. 365/222 |
| 2005/0044303 A1 | 2/2005 | Perego et al. ................... 711/5 |
| 2005/0044305 A1 | 2/2005 | Jakobs et al. ................ 711/105 |
| 2005/0047192 A1 | 3/2005 | Matsui et al. ................ 365/145 |
| 2005/0071543 A1 | 3/2005 | Ellis et al. .................... 711/106 |
| 2005/0078532 A1 | 4/2005 | Ruckerbauer et al. ........ 365/199 |
| 2005/0081085 A1 | 4/2005 | Ellis et al. ....................... 714/5 |
| 2005/0099834 A1 | 5/2005 | Funaba et al. .................. 365/63 |
| 2005/0102590 A1 | 5/2005 | Norris et al. ................. 714/719 |
| 2005/0105318 A1 | 5/2005 | Funaba et al. .................. 365/63 |
| 2005/0108460 A1 | 5/2005 | David |
| 2005/0127531 A1 | 6/2005 | Tay et al. |
| 2005/0132158 A1 | 6/2005 | Hampel et al. ............... 711/167 |
| 2005/0135176 A1 | 6/2005 | Ramakrishnan et al. |
| 2005/0138267 A1 | 6/2005 | Bains et al. .................. 711/100 |
| 2005/0138304 A1 | 6/2005 | Ramakrishnan et al. |
| 2005/0139977 A1 | 6/2005 | Nishio et al. ................ 257/686 |
| 2005/0141199 A1 | 6/2005 | Chiou et al. ................. 361/704 |
| 2005/0149662 A1 | 7/2005 | Perego et al. ................... 711/5 |
| 2005/0152212 A1 | 7/2005 | Yang et al. .................. 365/233 |
| 2005/0156934 A1 | 7/2005 | Perego et al. ................. 345/531 |
| 2005/0166026 A1 | 7/2005 | Ware et al. .................. 711/167 |
| 2005/0193163 A1 | 9/2005 | Perego et al. ................. 711/105 |
| 2005/0193183 A1 | 9/2005 | Barth et al. |
| 2005/0194676 A1 | 9/2005 | Fukuda et al. |
| 2005/0194991 A1 | 9/2005 | Dour et al. .................... 326/30 |
| 2005/0195629 A1 | 9/2005 | Leddige et al. ................ 365/51 |
| 2005/0201063 A1 | 9/2005 | Lee et al. |
| 2005/0204111 A1 | 9/2005 | Natarajan .................... 711/167 |
| 2005/0207255 A1 | 9/2005 | Perego et al. ................. 365/222 |
| 2005/0210196 A1 | 9/2005 | Perego et al. ................. 711/115 |

| | | | | | | |
|---|---|---|---|---|---|---|
| 2005/0223179 A1 | 10/2005 | Perego et al. ............... 711/154 | | 2007/0162700 A1 | 7/2007 | Fortin et al. .................. 711/118 |
| 2005/0224948 A1 | 10/2005 | Lee et al. ..................... 257/686 | | 2007/0188997 A1 | 8/2007 | Hockanson et al. |
| 2005/0232049 A1 | 10/2005 | Park | | 2007/0192563 A1 | 8/2007 | Rajan et al. .................. 711/202 |
| 2005/0235119 A1 | 10/2005 | Sechrest et al. ............. 711/158 | | 2007/0195613 A1 | 8/2007 | Rajan et al. ............. 365/189.05 |
| 2005/0235131 A1 | 10/2005 | Ware ............................ 711/203 | | 2007/0204075 A1 | 8/2007 | Rajan et al. |
| 2005/0237838 A1 | 10/2005 | Kwak et al. ................. 365/222 | | 2007/0216445 A1 | 9/2007 | Raghavan et al. ............. 326/83 |
| 2005/0243635 A1 | 11/2005 | Schaefer ....................... 365/227 | | 2007/0247194 A1 | 10/2007 | Jain .............................. 326/87 |
| 2005/0246558 A1 | 11/2005 | Ku | | 2007/0279084 A1 | 12/2007 | Oh et al. |
| 2005/0249011 A1 | 11/2005 | Maeda ......................... 365/222 | | 2007/0288683 A1 | 12/2007 | Panabaker et al. ........... 711/101 |
| 2005/0259504 A1 | 11/2005 | Murtugh et al. .............. 365/233 | | 2007/0288686 A1 | 12/2007 | Arcedera et al. ............. 711/103 |
| 2005/0263312 A1 | 12/2005 | Bolken et al. | | 2007/0288687 A1 | 12/2007 | Panabaker et al. ........... 711/103 |
| 2005/0265506 A1 | 12/2005 | Foss et al. .................... 375/376 | | 2008/0002447 A1 | 1/2008 | Gulachenski et al. |
| 2005/0269715 A1 | 12/2005 | Yoo .............................. 257/780 | | 2008/0010435 A1 | 1/2008 | Smith et al. |
| 2005/0278474 A1 | 12/2005 | Perersen et al. ................ 711/5 | | 2008/0025108 A1 | 1/2008 | Rajan et al. ............. 365/189.05 |
| 2005/0281096 A1 | 12/2005 | Bhakta et al. | | 2008/0025122 A1 | 1/2008 | Schakel et al. ................ 365/222 |
| 2005/0281123 A1 | 12/2005 | Bell et al. ................. 365/230.08 | | 2008/0025136 A1 | 1/2008 | Rajan et al. ............. 365/230.08 |
| 2005/0283572 A1 | 12/2005 | Ishihara ....................... 711/118 | | 2008/0025137 A1 | 1/2008 | Rajan et al. .................. 365/239 |
| 2005/0285174 A1 | 12/2005 | Saito et al. .................... 257/296 | | 2008/0027697 A1 | 1/2008 | Rajan et al. ..................... 703/14 |
| 2005/0289292 A1 | 12/2005 | Morrow et al. ................. 71/105 | | 2008/0027702 A1 | 1/2008 | Rajan et al. ..................... 703/21 |
| 2005/0289317 A1 | 12/2005 | Liou et al. .................... 711/170 | | 2008/0027703 A1 | 1/2008 | Rajan et al. ..................... 703/21 |
| 2006/0002201 A1 | 1/2006 | Janzen ......................... 365/191 | | 2008/0028135 A1 | 1/2008 | Rajan et al. |
| 2006/0010339 A1 | 1/2006 | Klein ............................... 714/5 | | 2008/0028136 A1 | 1/2008 | Schakel et al. ................ 711/106 |
| 2006/0026484 A1 | 2/2006 | Hollums ....................... 714/746 | | 2008/0028137 A1 | 1/2008 | Schakel et al. |
| 2006/0038597 A1 | 2/2006 | Becker et al. | | 2008/0031030 A1 | 2/2008 | Rajan et al. ..................... 365/63 |
| 2006/0039204 A1 | 2/2006 | Cornelius | | 2008/0031072 A1 | 2/2008 | Rajan et al. .................. 365/227 |
| 2006/0039205 A1 | 2/2006 | Cornelius ................. 365/189.05 | | 2008/0037353 A1 | 2/2008 | Rajan et al. .................. 365/227 |
| 2006/0041711 A1 | 2/2006 | Miura et al. .................. 711/103 | | 2008/0056014 A1 | 3/2008 | Rajan et al. ............. 365/189.03 |
| 2006/0041730 A1 | 2/2006 | Larson ......................... 711/167 | | 2008/0062773 A1 | 3/2008 | Rajan et al. ............. 365/189.03 |
| 2006/0044909 A1 | 3/2006 | Kinsley et al. ............... 365/222 | | 2008/0065820 A1 | 3/2008 | Gillingham et al. .......... 711/105 |
| 2006/0044913 A1 | 3/2006 | Klein et al. .................. 365/222 | | 2008/0082763 A1 | 4/2008 | Rajan et al. .................. 711/154 |
| 2006/0049502 A1 | 3/2006 | Goodwin et al. ............ 257/686 | | 2008/0086588 A1 | 4/2008 | Danilak et al. |
| 2006/0050574 A1 | 3/2006 | Streif et al. .................. 365/167 | | 2008/0089034 A1 | 4/2008 | Hoss et al. |
| 2006/0056244 A1 | 3/2006 | Ware ............................ 365/194 | | 2008/0098277 A1 | 4/2008 | Hazelzet |
| 2006/0062047 A1 | 3/2006 | Bhakta et al. | | 2008/0103753 A1 | 5/2008 | Rajan et al. |
| 2006/0067141 A1 | 3/2006 | Perego et al. ................ 365/200 | | 2008/0104314 A1 | 5/2008 | Rajan et al. |
| 2006/0085616 A1 | 4/2006 | Zeighami et al. | | 2008/0109206 A1 | 5/2008 | Rajan et al. |
| 2006/0087900 A1 | 4/2006 | Bucksch et al. | | 2008/0109595 A1 | 5/2008 | Rajan et al. |
| 2006/0090031 A1 | 4/2006 | Kirshenbaum et al. ....... 711/113 | | 2008/0109597 A1 | 5/2008 | Schakel et al. |
| 2006/0090054 A1 | 4/2006 | Choi et al. .................... 711/167 | | 2008/0109598 A1 | 5/2008 | Schakel et al. |
| 2006/0106951 A1 | 5/2006 | Bains ............................... 710/5 | | 2008/0115006 A1 | 5/2008 | Smith et al. .................. 713/601 |
| 2006/0112214 A1 | 5/2006 | Yeh ............................... 711/103 | | 2008/0120443 A1 | 5/2008 | Rajan et al. |
| 2006/0112219 A1 | 5/2006 | Chawla et al. | | 2008/0120458 A1 | 5/2008 | Gillingham et al. .......... 711/105 |
| 2006/0117152 A1 | 6/2006 | Amidi et al. .................. 711/154 | | 2008/0123459 A1 | 5/2008 | Rajan et al. .................. 365/227 |
| 2006/0117160 A1 | 6/2006 | Jackson et al. ............... 711/170 | | 2008/0126687 A1 | 5/2008 | Rajan et al. |
| 2006/0118933 A1 | 6/2006 | Haba ............................ 257/678 | | 2008/0126688 A1 | 5/2008 | Rajan et al. |
| 2006/0120193 A1 | 6/2006 | Casper ......................... 365/222 | | 2008/0126689 A1 | 5/2008 | Rajan et al. |
| 2006/0123265 A1 | 6/2006 | Ruckerbauer et al. ........ 713/500 | | 2008/0126690 A1 | 5/2008 | Rajan et al. .................. 711/105 |
| 2006/0126369 A1 | 6/2006 | Raghuram ....................... 365/51 | | 2008/0126692 A1 | 5/2008 | Rajan et al. |
| 2006/0129712 A1 | 6/2006 | Raghuram ....................... 710/52 | | 2008/0133825 A1 | 6/2008 | Rajan et al. |
| 2006/0129740 A1 | 6/2006 | Ruckerbauer et al. | | 2008/0155136 A1 | 6/2008 | Hishino |
| 2006/0129755 A1 | 6/2006 | Raghuram .................... 711/105 | | 2008/0159027 A1 | 7/2008 | Kim |
| 2006/0133173 A1 | 6/2006 | Jain et al. ..................... 365/222 | | 2008/0170425 A1 | 7/2008 | Rajan |
| 2006/0136791 A1 | 6/2006 | Nierle | | 2008/0195894 A1 | 8/2008 | Schreck et al. |
| 2006/0149982 A1 | 7/2006 | Vogt ............................. 713/320 | | 2008/0239857 A1 | 10/2008 | Rajan et al. .................. 365/227 |
| 2006/0174082 A1 | 8/2006 | Bellows et al. | | 2008/0239858 A1 | 10/2008 | Rajan et al. .................. 365/227 |
| 2006/0176744 A1 | 8/2006 | Stave ........................... 365/194 | | 2009/0024789 A1 | 1/2009 | Rajan et al. |
| 2006/0179333 A1 | 8/2006 | Brittain et al. ............... 713/320 | | 2009/0024790 A1 | 1/2009 | Rajan et al. |
| 2006/0179334 A1 | 8/2006 | Brittain et al. ............... 713/320 | | 2009/0109613 A1 | 4/2009 | Legen et al. |
| 2006/0180926 A1 | 8/2006 | Mullen et al. | | 2009/0216939 A1 | 8/2009 | Smith et al. |
| 2006/0181953 A1 | 8/2006 | Rotenberg et al. | | 2009/0285031 A1 | 11/2009 | Rajan et al. |
| 2006/0195631 A1 | 8/2006 | Rajamani | | 2009/0290442 A1 | 11/2009 | Rajan |
| 2006/0198178 A1 | 9/2006 | Kinsley et al. ................. 365/52 | | 2010/0005218 A1 | 1/2010 | Gower et al. |
| 2006/0203590 A1 | 9/2006 | Mori et al. .................... 365/222 | | 2010/0020585 A1 | 1/2010 | Rajan |
| 2006/0206738 A1 | 9/2006 | Jeddeloh et al. ............. 713/320 | | 2010/0257304 A1 | 10/2010 | Rajan et al. |
| 2006/0233012 A1 | 10/2006 | Sekiguchi et al. .............. 365/51 | | 2010/0271888 A1 | 10/2010 | Rajan et al. |
| 2006/0236165 A1 | 10/2006 | Cepulis et al. | | 2010/0281280 A1 | 11/2010 | Rajan et al. |
| 2006/0236201 A1 | 10/2006 | Gower et al. | | | | |
| 2006/0248261 A1 | 11/2006 | Jacob et al. | | FOREIGN PATENT DOCUMENTS | | |
| 2006/0248387 A1 | 11/2006 | Nicholson et al. ............. 714/22 | | DE | 102004053316 | 5/2006 |
| 2006/0262586 A1 | 11/2006 | Solomon et al. | | DE | 102005036528 | 2/2007 |
| 2006/0294295 A1 | 12/2006 | Fukuzo ........................ 711/105 | | EP | 0644547 | 3/1995 |
| 2007/0005998 A1 | 1/2007 | Jain et al. | | JP | 62121978 | 6/1987 |
| 2007/0050530 A1 | 3/2007 | Rajan .............................. 711/5 | | JP | 01171047 | 7/1989 |
| 2007/0058471 A1 | 3/2007 | Rajan et al. .................. 365/222 | | JP | 03-029357 | 2/1991 |
| 2007/0070669 A1 | 3/2007 | Tsern ............................. 365/51 | | JP | 03029357 | 2/1991 |
| 2007/0088995 A1 | 4/2007 | Tsern et al. ................... 714/724 | | JP | 03/276487 | 12/1991 |
| 2007/0091696 A1 | 4/2007 | Niggemeier et al. | | JP | 03286234 | 12/1991 |
| 2007/0106860 A1 | 5/2007 | Foster et al. .................. 711/170 | | JP | 07-141870 | 6/1995 |
| 2007/0136537 A1 | 6/2007 | Doblar et al. | | JP | 08/077097 | 3/1996 |

| | | |
|---|---|---|
| JP | 08077097 | 3/1996 |
| JP | 11-149775 | 6/1999 |
| JP | 2002025255 | 1/2002 |
| JP | 3304893 B2 | 5/2002 |
| JP | 2006236388 | 9/2006 |
| KR | 1020040062717 | 7/2004 |
| WO | WO 95/05676 | 2/1995 |
| WO | WO9900734 | 1/1999 |
| WO | WO01/90900 | 11/2001 |
| WO | WO01/97160 | 12/2001 |
| WO | WO2007002324 | 1/2007 |
| WO | WO2007/028109 | 3/2007 |
| WO | WO 2007/038225 | 4/2007 |
| WO | WO2007/095080 | 8/2007 |
| WO | WO2008063251 | 5/2008 |

OTHER PUBLICATIONS

Final Rejection from U.S. Appl. No. 11/762,010 Mailed Dec. 4, 2009.
Non-Final Rejection from U.S. Appl. No. 11/672,921 Mailed Dec. 8, 2009.
Non-Final Rejection from U.S. Appl. No. 11/672,924 Mailed Dec. 14, 2009.
Non-Final Rejection from U.S. Appl. No. 11/929,225 Mailed Dec. 14, 2009.
Non-Final Rejection from U.S. Appl. No. 11/929,261 Mailed Dec. 14, 2009.
Notice of Allowance From U.S. Appl. No. 11/611,374 Mailed Nov. 30, 2009.
Notice of Allowance From U.S. Appl. No. 11/939,432 Mailed Dec. 1, 2009.
Notice of Allowance From U.S. Appl. No. 12/111,819 Mailed Nov. 20, 2009.
Notice of Allowance From U.S. Appl. No. 12/111,828 Mailed Dec. 15, 2009.
Non-final Office Action from U.S. Appl. No. 11/461,430 mailed on Feb. 19, 2009.
Final Office Action from U.S. Appl. No. 11/461,435 mailed on Jan. 28, 2009.
Non-final Office Action from U.S. Appl. No. 11/461,437 mailed on Jan. 26, 2009.
Non-final Office Action from U.S. Appl. No. 11/939,432 mailed on Feb. 6, 2009.
Wu et al., "eNVy: A Non-Volatile, Main Memory Storage System," ASPLOS-VI Proceedings—Sixth International Conference on Architectural Support for Programming Languages and Operating Systems, San Jose, California, Oct. 4-7, 1994. SIGARCH Computer Architecture News 22(Special Issue Oct. 1994).
Great Britain Office Action from GB Patent Application No. GB0800734.6 Mailed Mar. 1, 2010.
Final Office Action from U.S. Appl. No. 11/461,420 Mailed Apr. 28, 2010.
Notice of Allowance from U.S. Appl. No. 11/553,372 Mailed Mar. 12, 2010.
Notice of Allowance from U.S. Appl. No. 11/553,399 Mailed Mar. 22, 2010.
Non-Final Office Action from U.S. Appl. No. 11/588,739 Mailed Dec. 29, 2009.
Notice of Allowance from U.S. Appl. No. 11/611,374 Mailed Apr. 5, 2010.
Non-Final Office Action from U.S. Appl. No. 11/828,181 Mailed Mar. 2, 2010.
Non-Final Office Action from U.S. Appl. No. 11/828,182 Mailed Mar. 29, 2010.
Final Office Action from U.S. Appl. No. 11/858,518 Mailed Apr. 21, 2010.
Non-Final Office Action from U.S. Appl. No. 11/929,432 Mailed Jan. 14, 2010.
Non-Final Office Action from U.S. Appl. No. 11/929,571 Mailed Mar. 3, 2010.
Non-Final Office Action from U.S. Appl. No. 11/929,631 Mailed Mar. 3, 2010.
Non-Final Office Action from U.S. Appl. No. 11/929,636 Mailed Mar. 9, 2010.
Non-Final Office Action from U.S. Appl. No. 11/929,655 Mailed Mar. 3, 2010.
Non-Final Office Action from U.S. Appl. No. 11/939,432 Mailed Apr. 12, 2010.
Notice of Allowance from U.S. Appl. No. 12/111,819 Mailed Mar. 10, 2010.
Non-Final Office Action from U.S. Appl. No. 12/507,682 Mailed Mar. 8, 2010.
German Office Action From German Patent Application No. 11 2006 002 300.4-55 Mailed Jun. 5, 2009 (With Translation).
Non-Final Office Action From U.S. Appl. No. 11/461,430 Mailed Feb. 19, 2009.
Final Office Action From U.S. Appl. No. 11/461,435 Mailed Jan. 28, 2009.
Non-Final Office Action From U.S. Appl. No. 11/461,437 Mailed Jan. 26, 2009.
Non-Final Office Action From U.S. Appl. No. 11/461,441 Mailed Apr. 2, 2009.
Non-Final Office Action From U.S. Appl. No. 11/611,374 Mailed Mar. 23, 2009.
Non-Final Office Action From U.S. Appl. No. 11/762,010 Mailed Mar. 20, 2009.
Non-Final Office Action From U.S. Appl. No. 11/939,432 Mailed Feb. 6, 2009.
Non-Final Office Action From U.S. Appl. No. 12/111,819 Mailed Apr. 27, 2009.
Non-Final Office Action From U.S. Appl. No. 12/111,828 Mailed Apr. 17, 2009.
U.S. Appl. No. 11/588,739, filed Oct. 27, 2006.
Kellerbauer "Die Schnelle Million," with translation, "The quick million.".
Wu et al., "eNVy: A Non-Volatile, Main Memory Storage System," to appear in ASPLOS VI.
"Using Two Chip Selects to Enable Quad Rank," IP.com PriorArtDatabase, copyright IP.com, Inc. 2004.
"BIOS and Kernel Developer's Guide (BKDG) for AMD Family 10h Processors," AMD, 31116 Rev 3.00, Sep. 7, 2007.
Skerlj et al., "Buffer Device For Memory Modules (DIMM)" Qimonda 2006, p. 1.
Written Opinion from PCT Application No. PCT/US06/24360 mailed on Jan. 8, 2007.
Preliminary Report on Patentability from PCT Application No. PCT/US06/24360 mailed on Jan. 10, 2008.
Written Opinion from International PCT Applitation No. PCT/US06/34390 mailed on Nov. 21, 2007.
International Search Report from PCT Application No. PCT/US06/34390 mailed on Nov. 21, 2007.
Office Action from U.S. Appl. No. 11/461,427 mailed on Sep. 5, 2008.
Final Office Action from U.S. Appl. No. 11/461,430 mailed on Sep. 8, 2008.
Notice of Allowance from U.S. Appl. No. 11/474,075 mailed on Nov. 26, 2008.
Office Action from U.S. Appl. No. 11/474,076 mailed on Nov. 3, 2008.
Office Action from U.S. Appl. No. 11/524,811 mailed on Sep. 17, 2008.
Notice of Allowance from U.S. Appl. No. 11/762,013 Dated Feb. 23, 2011.
Notice of Allowance from U.S. Appl. No. 11/929,500 Dated Feb. 24, 2011.
Notice of Allowance from U.S. Appl. No. 11/763,365 Dated Mar. 1, 2011.
Final Office Action from U.S. Appl. No. 12/574,628 Dated Mar. 3, 2011.
Final Office Action from U.S. Appl. No. 11/929,571 Dated Mar. 3, 2011.
Notice of Allowance from U.S. Appl. No. 11/611,374 Dated Mar. 4, 2011.
Notice of Allowance from U.S. Appl. No. 11/929,483 Dated Mar. 4, 2011.
Notice of Allowance from U.S. Appl. No. 11/553,399 Dated Mar. 18, 2011.

Final Office Action from U.S. Appl. No. 12/507,682 Dated Mar. 29, 2011.
Non-Final Office Action from U.S. Appl. No. 11/929,403 Dated Mar. 31, 2011.
Notice of Allowance from U.S. Appl. No. 12/838,896 Dated Apr. 19, 2011.
Notice of Allowance from U.S. Appl. No. 11/702,981 Dated Apr. 25, 2011.
Notice of Allowance from U.S. Appl. No. 11/929,320 Dated May 5, 2011.
Final Office Action from U.S. Appl. No. 11/939,440 Dated May 19, 2011.
Final Office Action from U.S. Appl. No. 11/855,805, Dated May 26, 2011.
Non-Final Office Action from U.S. Appl. No. 11/672,921 Dated May 27, 2011.
Notice of Allowance from U.S. Appl. No. 11/762,010 Dated Jun. 8, 2011.
Non-Final Office Action from U.S. Appl. No. 11/672,924 Dated Jun. 8, 2011.
Non-Final Office Action from U.S. Appl. No. 11/929,225 Dated Jun. 8, 2011.
Notice of Allowance from U.S. Appl. No. 11/929,500 Dated Jun. 13, 2011.
Notice of Allowance from U.S. Appl. No. 11/941,589 Dated Jun. 15, 2011.
Final Office Action from U.S. Appl. No. 12/057,306 Dated Jun. 15, 2011.
Final Office Action from U.S. Appl. No. 12/769,428 Dated Jun. 16, 2011.
Notice of Allowance from U.S. Appl. No. 12/203,100 Dated Jun. 17, 2011.
Notice of Allowance from U.S. Appl. No. 11/762,013 Dated Jun. 20, 2011.
Non-Final Office Action from U.S. Appl. No. 12/797,557 Dated Jun. 21, 2011.
Notice of Allowance from U.S. Appl. No. 11/929,483 Dated Jun. 23, 2011.
Non-Final Office Action from U.S. Appl. No. 11/702,960 Dated Jun. 23, 2011.
Non-Final Office Action from U.S. Appl. No. 11/929,655 Dated Jun. 24, 2011.
Notice of Allowance from U.S. Appl. No. 11/763,365 Dated Jun. 24, 2011.
Notice of Allowance from U.S. Appl. No. 11/611,374 Dated Jun. 24, 2011.
Non-Final Office Action from U.S. Appl. No. 11/828,182 Dated Jun. 27, 2011.
Non-Final Office Action from U.S. Appl. No. 11/828,181 Dated Jun. 27, 2011.
Non-Final Office Action from U.S. Appl. No. 12/378,328 Dated Jul. 15, 2011.
Final Office Action from U.S. Appl. No. 11/461,420 Dated Jul. 20, 2011.
Notice of Allowance from U.S. Appl. No. 11/461,437 Dated Jul. 25, 2011.
Fang et al., W. Power Complexity Analysis of Adiabatic SRAM, 6th Int. Conference On ASIC, vol. 1, Oct. 2005, pp. 334-337.
Pavan et al., P. A Complete Model of E2PROM Memory Cells for Circuit Simulations, IEEE Transactions on Computer-Aided Design of Integrated Circuits and Systems, vol. 22, No. 8, Aug. 2003, pp. 1072-1079.
German Office Action from German Patent Application No. 11 2006 001 810.8-55 Dated Feb. 18, 2009 (With Translation).
Non-Final Office Action from U.S. Appl. No. 11/461,420 Dated Jul. 23, 2009.
Notice of Allowance from U.S. Appl. No. 11/461,430 Dated Sep. 9, 2009.
Non-Final Office Action from U.S. Appl. No. 11/461,435 Dated Aug. 5, 2009.
Non-Final Office Action from U.S. Appl. No. 11/515,167 Dated Sep. 25, 2009.
Non-Final Office Action from U.S. Appl. No. 11/515,223 Dated Sep. 22, 2009.
Non-Final Office Action from U.S. Appl. No. 11/538,041 Dated Jun. 10, 2009.
Non-Final Office Action from U.S. Appl. No. 11/553,372 Dated Jun. 25, 2009.
Notice of Allowance from U.S. Appl. No. 11/553,372 Dated Sep. 30, 2009.
Non-Final Office Action from U.S. Appl. No. 11/553,390 Dated Sep. 9, 2009.
Non-Final Office Action from U.S. Appl. No. 11/553,399 Dated Jul. 7, 2009.
Notice of Allowance from U.S. Appl. No. 11/553,399 Dated Oct. 13, 2009.
Notice of Allowance from U.S. Appl. No. 11/611,374 Dated Sep. 15, 2009.
Non-Final Office Action from U.S. Appl. No. 11/702,960 Dated Sep. 25, 2009.
Non-Final Office Action from U.S. Appl. No. 11/702,981 Dated Aug. 19, 2009.
Non-Final Office Action from U.S. Appl. No. 11/762,013 Dated Jun. 5, 2009.
Non-Final Office Action from U.S. Appl. No. 11/763,365 Dated Oct. 28, 2009.
Non-Final Office Action from U.S. Appl. No. 11/858,518 Dated Aug. 14, 2009.
Non-Final Office Action from U.S. Appl. No. 11/929,500 Dated Oct. 13, 2009.
Notice of Allowance from U.S. Appl. No. 11/939,432 Dated Sep. 24, 2009.
Non-Final Office Action from U.S. Appl. No. 11/941,589 Dated Oct. 1, 2009.
Supplemental European Search Report and Search Opinion issued Sep. 21, 2009 in European Application No. 07870726.2, 8 pp.
Wu et al., "eNVy: A Non-Volatile, Main Memory Storage System", ASPLOS-VI Proceedings, Oct. 4-7, 1994, pp. 86-97.
Buffer Device for Memory Modules (DIMM), IP.com Prior Art Database, <URL: http://ip.com/IPCOM/000144850>, Feb. 10, 2007, 1 pg.
German Office Action from German Patent Application No. 11 2006 002 300.4-55 Dated May 11, 2009 (With Translation).
Great Britain Office Action from GB Patent Application No. GB0803913.3 Dated Mar. 1, 2010.
International Preliminary Examination Report From PCT Application No. PCT/US07/016385 Dated Feb. 3, 2009.
Search Report and Written Opinion From PCT Application No. PCT/US07/03460 Dated on Feb. 14, 2008.
Final Office Action from U.S. Appl. No. 11/461,435 Dated May 13, 2010.
Final Office Action from U.S. Appl. No. 11/515,167 Dated Jun. 3, 2010.
Notice of Allowance from U.S. Appl. No. 11/515,223 Dated Jul. 30, 2010.
Notice of Allowance from U.S. Appl. No. 11/553,372 Dated Aug. 4, 2010.
Final Office Action from U.S. Appl. No. 11/553,390 Dated Jun. 24, 2010.
Notice of Allowance from U.S. Appl. No. 11/553,399 Dated Dec. 3, 2010.
Notice of Allowance from U.S. Appl. No. 11/611,374 Dated Jul. 19, 2010.
Notice of Allowance from U.S. Appl. No. 11/611,374 Dated Oct. 29, 2010.
Final Office Action from U.S. Appl. No. 11/672,921 Dated Jul. 23, 2010.
Final Office Action from U.S. Appl. No. 11/672,924 Dated Sep. 7, 2010.
Final Office Action from U.S. Appl. No. 11/702,960 Dated Jun. 21, 2010.
Non-Final Office Action from U.S. Appl. No. 11/702,981 Dated Mar. 11, 2009.
Notice of Allowance from U.S. Appl. No. 11/762,010 Dated Jul. 2, 2010.

Notice of Allowance from U.S. Appl. No. 11/762,010 Dated Oct. 22, 2010.
Notice of Allowance from U.S. Appl. No. 11/762,013 Dated Aug. 17, 2010.
Notice of Allowance from U.S. Appl. No. 11/762,013 Dated Dec. 7, 2010.
Notice of Allowance from U.S. Appl. No. 11/763,365 Dated Jun. 29, 2010.
Notice of Allowance from U.S. Appl. No. 11/763,365 Dated Oct. 20, 2010.
Non-Final Office Action from U.S. Appl. No. 11/855,805 Dated Sep. 21, 2010.
Non-Final Office Action from U.S. Appl. No. 11/858,518 Dated Sep. 8, 2010.
Final Office Action from U.S. Appl. No. 11/929,225 Dated Aug. 27, 2010.
Final Office Action from U.S. Appl. No. 11/929,261 Dated Sep. 7, 2010.
Final Office Action from U.S. Appl. No. 11/929,286 Dated Aug. 20, 2010.
Notice of Allowance from U.S. Appl. No. 11/929,320 Dated Sep. 29, 2010.
Final Office Action from U.S. Appl. No. 11/929,403 Dated Aug. 31, 2010.
Final Office Action from U.S. Appl. No. 11/929,417 Dated Aug. 31, 2010.
Final Office Action from U.S. Appl. No. 11/929,432 Dated Aug. 20, 2010.
Final Office Action from U.S. Appl. No. 11/929,450 Dated Aug. 20, 2010.
Notice of Allowance from U.S. Appl. No. 11/929,483 Dated Oct. 07, 2010.
Final Office Action from U.S. Appl. No. 11/929,500 Dated Jun. 24, 2010.
Final Office Action from U.S. Appl. No. 11/929,631 Dated Nov. 18, 2010.
Final Office Action from U.S. Appl. No. 11/929,655 Dated Nov. 22, 2010.
Non-Final Office Action from U.S. Appl. No. 11/939,440 Dated Sep. 17, 2010.
Notice of Allowance from U.S. Appl. No. 11/941,589 Dated Oct. 25, 2010.
Non-Final Office Action from U.S. Appl. No. 12/057,306 Dated Oct. 8, 2010.
Non-Final Office Action from U.S. Appl. No. 12/203,100 Dated Dec. 1, 2010.
Non-Final Office Action from U.S. Appl. No. 12/574,628 Dated Jun. 10, 2010.
Non-Final Office Action from U.S. Appl. No. 12/769,428 Dated Nov. 8, 2010.
Non-Final Office Action from U.S. Appl. No. 12/838,896 Dated Sep. 3, 2010.
US 6,330,663, 12/2001, Jeddeloh (withdrawn)

* cited by examiner

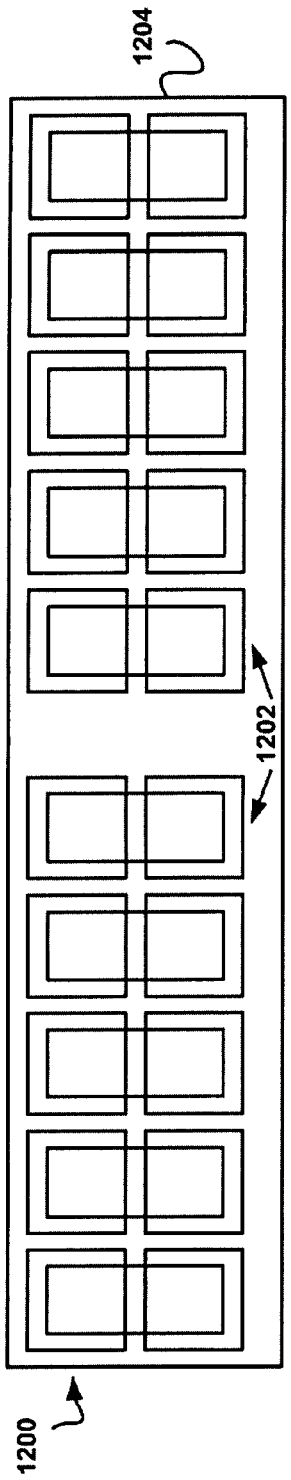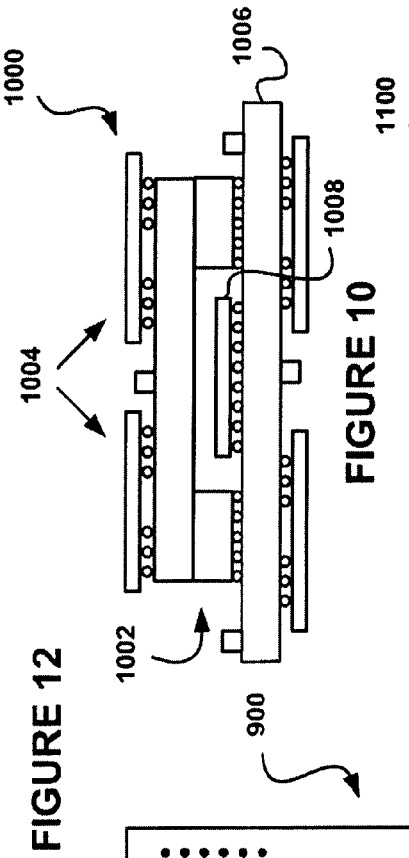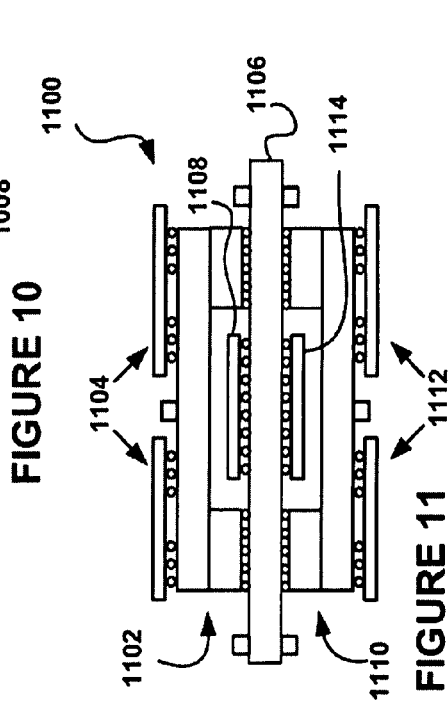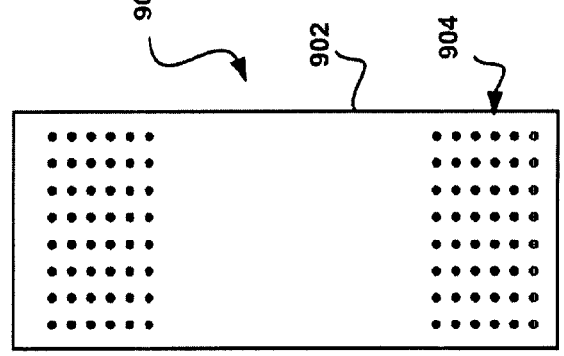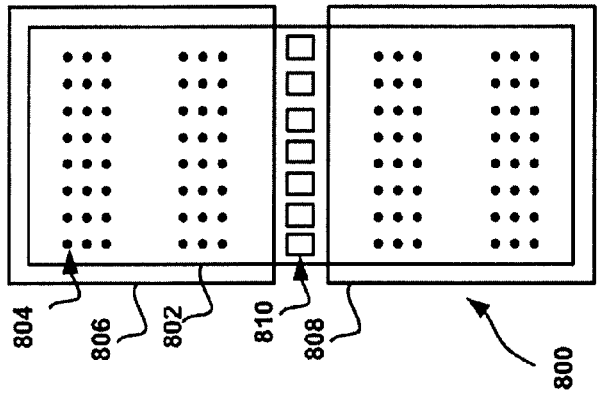
FIGURE 8
FIGURE 9
FIGURE 10
FIGURE 11
FIGURE 12

PROVIDING ADDITIONAL SPACE BETWEEN AN INTEGRATED CIRCUIT AND A CIRCUIT BOARD FOR POSITIONING A COMPONENT THEREBETWEEN

FIELD OF THE INVENTION

The present invention relates to circuit boards, and more particularly to circuit board design.

BACKGROUND

There is an ever-increasing desire for smaller and more compact electronics with an increasing amount of functionality. One challenge in the design of electronics involves the use of the same amount of electrical components (or more) in a smaller space on a circuit board. In many cases, a designer may have many electronic components to place on very little circuit board surface area.

There is thus a need for addressing these and/or other issues associated with the prior art.

SUMMARY

A system, method, and apparatus are included for providing additional space between an integrated circuit package and a circuit board. An integrated circuit package is provided including a plurality of integrated circuit package contacts. Also provided is a circuit board in electrical communication with the integrated circuit package. Further, the integrated circuit package, the integrated circuit contacts, and/or the circuit board is configured for providing additional space between the integrated circuit package and the circuit board to position at least a portion of at least one component between the integrated circuit package and the circuit board.

BRIEF DESCRIPTION OF THE DRAWINGS

FIG. 8 is a top view of an apparatus for electrical communication between integrated circuit package contacts of multiple integrated circuit packages and circuit board contacts of a circuit board, in accordance with one embodiment.

FIG. 9 is a bottom view of an apparatus for electrical communication between integrated circuit package contacts of an integrated circuit package and circuit board contacts of a circuit board, in accordance with another embodiment.

FIG. 10 shows a system comprising an apparatus for electrical communication between integrated circuit package contacts of integrated circuit packages and circuit board contacts of a circuit board, in accordance with one embodiment.

FIG. 11 shows a system comprising multiple apparatuses for electrical communication between integrated circuit package contacts of integrated circuit packages and circuit board contacts of a circuit board, in accordance with one embodiment.

FIG. 12 is a top view of a system comprising multiple apparatuses for electrical communication between integrated circuit package contacts of integrated circuit packages and circuit board contacts of a circuit board, in accordance with another embodiment.

DETAILED DESCRIPTION

Figure 1:
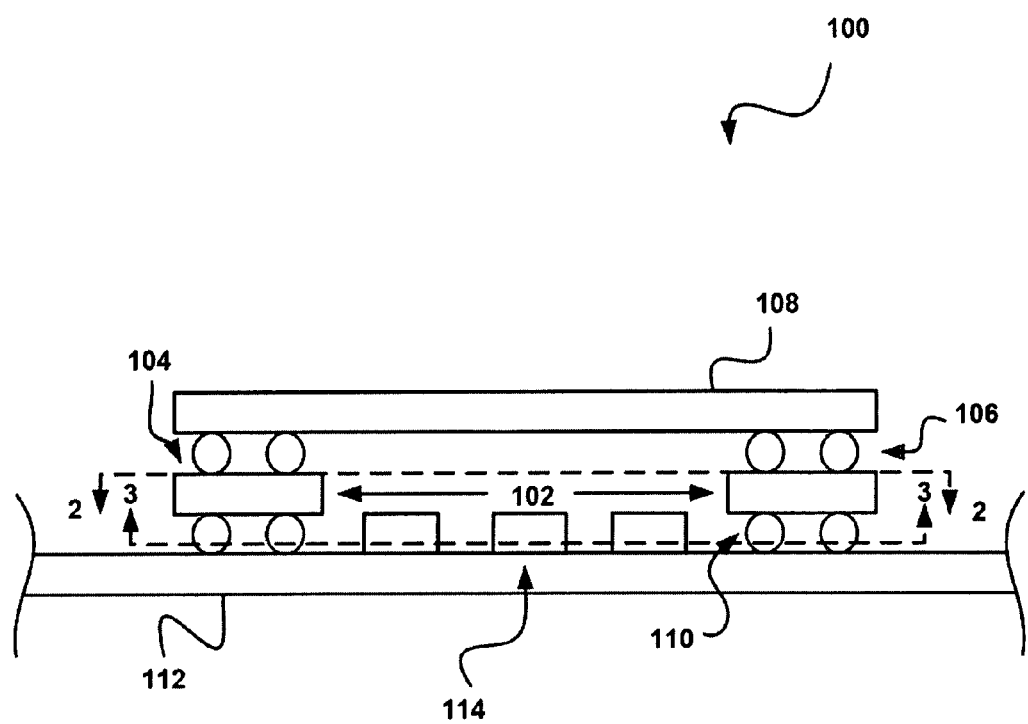
FIG. 1 shows an apparatus for electrical communication between integrated circuit package contacts of an integrated circuit package and circuit board contacts of a circuit board, in accordance with one embodiment.

FIG. 1 shows an apparatus 100 for electrical communication between integrated circuit package contacts of an integrated circuit package and circuit board contacts of a circuit board, in accordance with one embodiment. As shown, a body 102 is provided. In one embodiment, the body 102 may be planar. Additionally, strictly as an option, the body 102 may include a frame. In such case, the frame may define an outer periphery and an inner periphery, for example.

Further, a plurality of first contacts 104 are provided. The first contacts 104 are positioned on a first side of the body 102 and configured for electrical communication with integrated circuit package contacts 106 of an integrated circuit package 108. In the context of the present description, an integrated circuit package refers to any integrated circuit or a package including any integrated circuit.

For example, in various embodiments, the integrated circuit package may include an integrated circuit with integrated circuit contacts, a body encompassing an integrated circuit with contacts for the body, and/or any other package which meets the above definition. In one embodiment, the first contacts 104 may be positioned on the first side of the body 102 and configured for direct electrical communication with integrated circuit contacts of an integrated circuit. In this case, the integrated circuit may or may not include any additional components (e.g. a package body, package body contacts, etc.) as part of the integrated circuit package.

In one embodiment, the integrated circuit package 108 may include memory [e.g. dynamic random access memory (DRAM), etc.]. Of course, however, other types of integrated circuit packages and integrated circuits (e.g. flash memory, controllers, processors, etc.) are also contemplated. Further, in various other embodiments, the integrated circuit package 108 may be used in a computer system, cellular phone, personal digital assistant (PDA), digital camera, digital video recorder, global positioning system (GPS), and any other electrical device which uses integrated circuits.

Additionally, a plurality of second contacts 110 are provided. The second contacts 110 are positioned on a second side of the body 102 and configured for electrical communication with circuit board contacts (not shown) of a circuit board 112. In one embodiment, the second contacts 110 may include ball contacts for engaging the circuit board contacts. In another embodiment, the second contacts 110 may include pin contacts for engaging the circuit board contacts.

In addition, the second contacts 110 are in electrical communication with the first contacts 104 for allowing electrical communication between the integrated circuit package contacts 106 and the circuit board contacts. Strictly as an option, the first contacts 104 may be planar for engaging the integrated circuit package contacts 106.

In one embodiment where the body 102 includes a frame, the inner periphery of the frame may define a space for allowing positioning of components between the integrated circuit package 108 and the circuit board 112, in the manner shown. Further, the outer periphery of the frame may have a size that is substantially the same as a size of the integrated circuit package, as illustrated. Thus, in such embodiment, the body 102 may be configured to allow positioning of components between the integrated circuit package 108 and the circuit board 112 (e.g. components 114).

In various embodiments, the components 114 may include passive components, active components, or a combination of passive and active components. In the context of the present description, passive components refer to any component that consumes electrical energy and/or is incapable of power gain. For example, in various embodiments, passive components may include, but are not limited to, capacitors, inductors, resistors, and/or any other component that meets the above definition. Further, in the context of the present description, active components refer to any component that may be used to provide power gain in an electronic circuit. For example, in various embodiments, active components may include, but are not limited to, transistors, operational amplifiers, various diodes, and/or any other component that meets the above definition.

Figure 2:
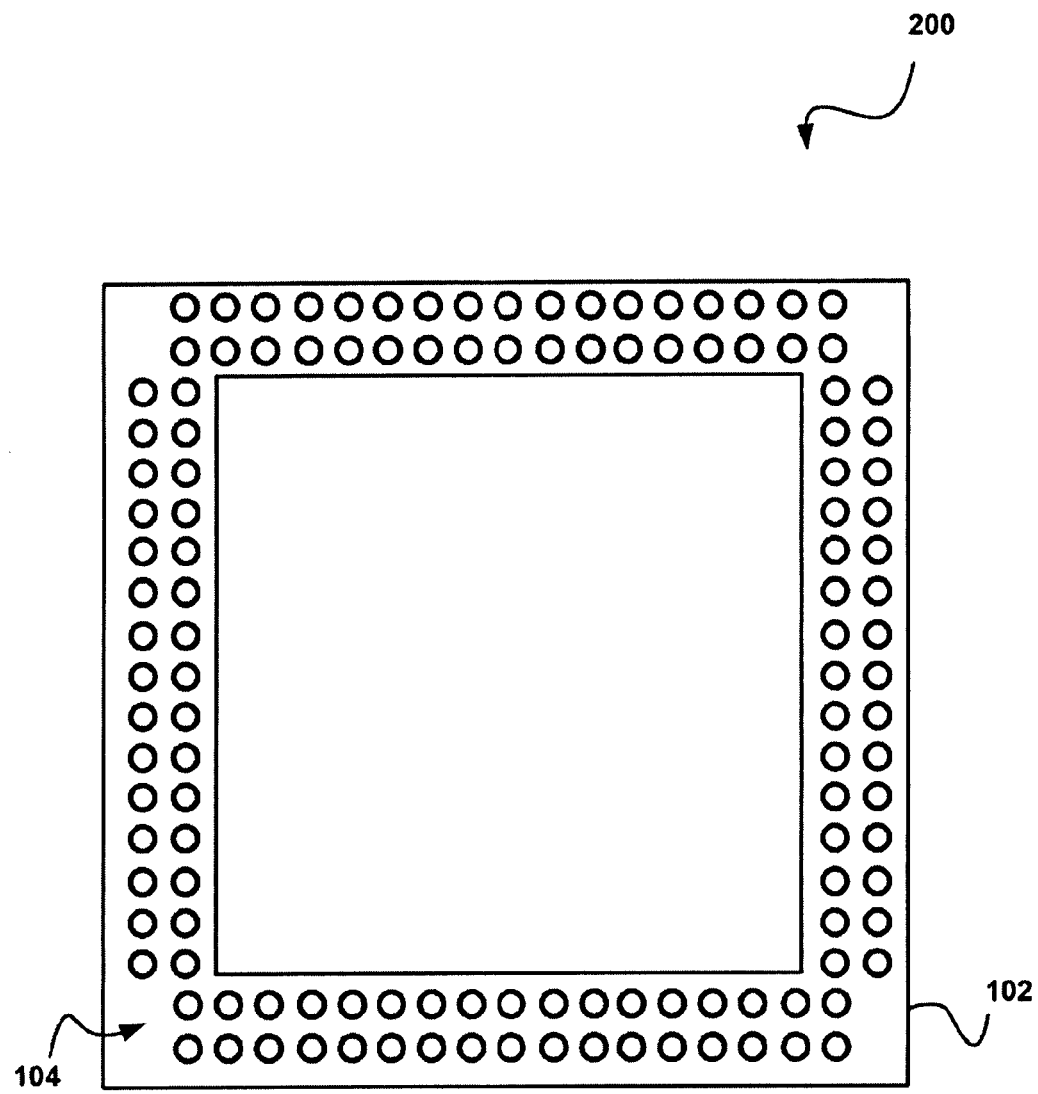
FIG. 2 shows a cross-section of a body of the apparatus of FIG. 1 taken along line 2-2 of FIG. 1, illustrating a plurality of first contacts, in accordance with one embodiment.

FIG. 2 shows a cross-section 200 of the body 102 of the apparatus of FIG. 1 taken along line 2-2 of FIG. 1, illustrating the plurality of first contacts 104, in accordance with one embodiment. As noted above, in one embodiment, the first contacts 104 may be planar for engaging the integrated circuit package contacts 106. It should be noted, however, that the first contacts 104 may be any type of contacts which allow engagement of any type of integrated circuit or integrated circuit package. In various embodiments, such contacts may include pads, balls, pins, slots, grooves, and/or any other type of contact for engaging integrated circuit contacts or integrated circuit package contacts.

As shown, the first contacts 104 are comprised of two perimeter rows of contacts. However, it should be noted that the number of contacts and/or rows of contacts may vary depending on the integrated circuit package to be engaged. In various embodiments, two or three rows of contacts may comprise the first contacts 104. However, any number of rows may be utilized depending on the integrated circuit package to be engaged.

Figure 3:
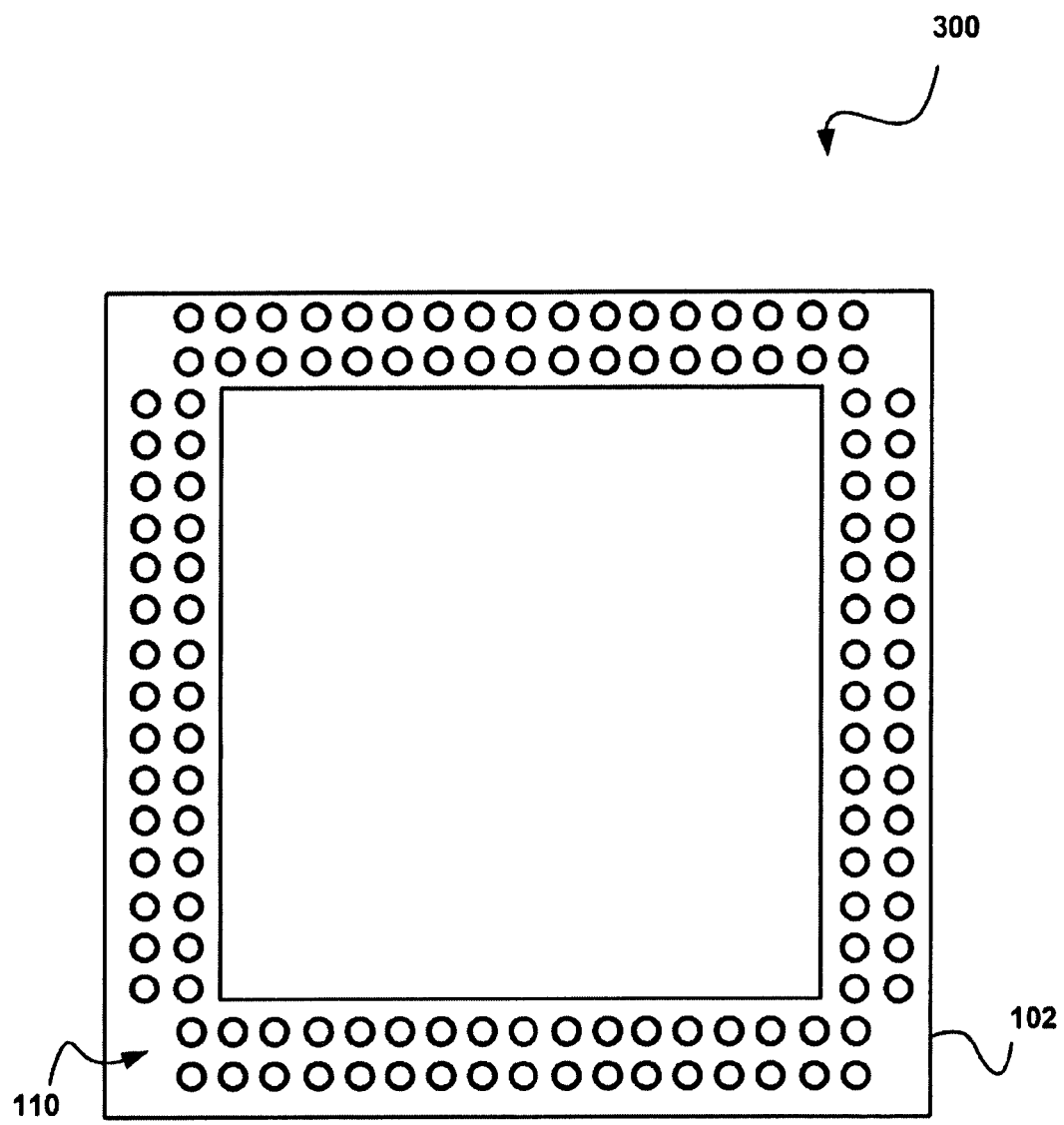
FIG. 3 shows another cross-section of the body of the apparatus of FIG. 1 taken along line 3-3 of FIG. 1, illustrating a plurality of second contacts, in accordance with one embodiment.

FIG. 3 shows another cross-section 300 of the body 102 of the apparatus of FIG. 1 taken along line 3-3 of FIG. 1, illustrating the plurality of second contacts 110, in accordance with one embodiment. As noted above, in various embodiments, the second contacts 110 may include ball contacts for engaging the circuit board contacts or pin contacts for engaging the circuit board contacts. It should be noted, however, that any types of contacts may be utilized depending on the circuit board to be engaged. In various embodiments, such contacts may include pads, balls, pins, slots, grooves, and/or any other type of contact for engaging circuit board contacts.

As shown, the second contacts 110 are comprised of two perimeter rows of contacts. It should be noted that the number of contacts and/or rows of contacts may vary depending on the circuit board to be engaged. In various embodiments, two or three rows of contacts may comprise the second contacts 110. However, any number of rows may be utilized depending on the circuit board to be engaged.

More illustrative information will now be set forth regarding various optional architectures and features with which the foregoing framework may or may not be implemented, per the desires of the user. It should be strongly noted that the following information is set forth for illustrative purposes and should not be construed as limiting in any manner. Any of the following features may be optionally incorporated with or without the exclusion of other features described.

Figure 4:
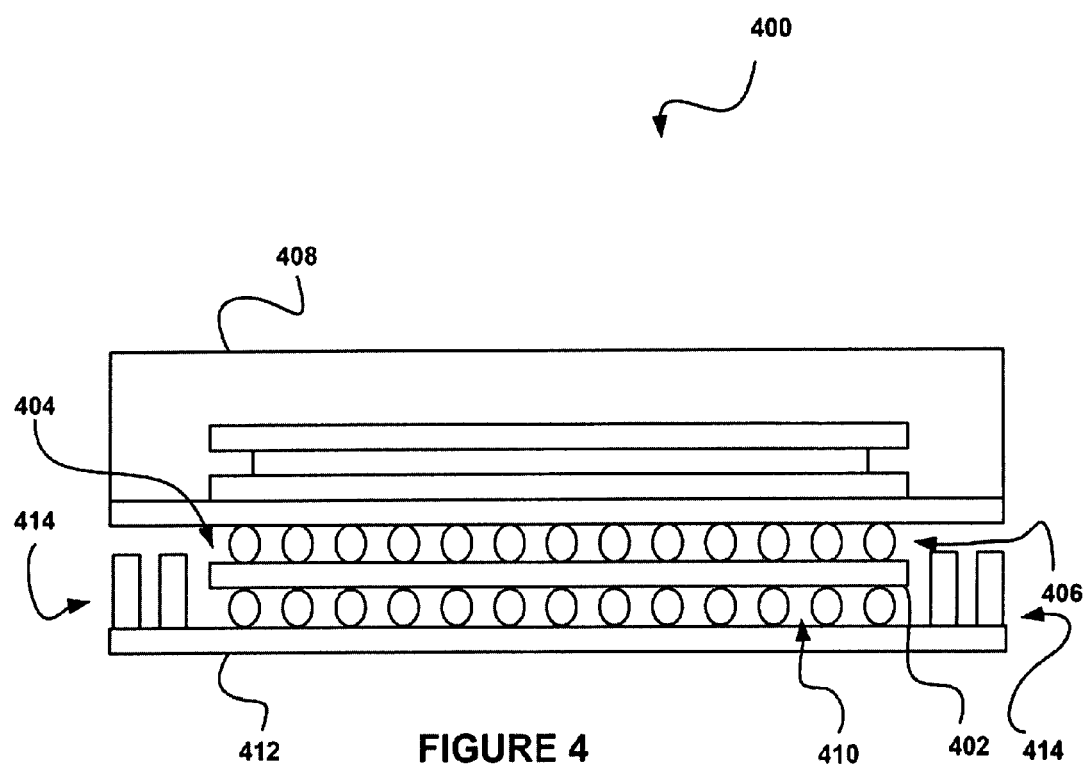
FIG. 4 shows an apparatus for electrical communication between integrated circuit package contacts of an integrated circuit package and circuit board contacts of a circuit board, in accordance with another embodiment.

FIG. 4 shows an apparatus 400 for electrical communication between integrated circuit package contacts of an integrated circuit package and circuit board contacts of a circuit board, in accordance with another embodiment. While FIG. 4 sets forth one embodiment, the aforementioned definitions may equally apply to the description below.

As shown, a body 402 is provided. As an option, the body 402 may be planar. Additionally, an outer periphery of the body 402 may have a size that is less than a size of the integrated circuit package 408. As shown, such outer periphery may thus define a space for reasons that will soon become apparent.

Further, a plurality of first contacts 404 are provided. The first contacts 404 are positioned on a first side of the body 402 and configured for electrical communication with integrated circuit package contacts 406 of the integrated circuit package 408. In one embodiment, the integrated circuit package 408 may include DRAM.

Additionally, a plurality of second contacts 410 are provided. The second contacts 410 are positioned on a second side of the body 402 and configured for electrical communication with circuit board contacts of a circuit board 412. In one embodiment, the second contacts 410 may include ball contacts for engaging the circuit board contacts. In another embodiment, the second contacts 410 may include pin contacts for engaging the circuit board contacts.

In addition, the second contacts 410 are in electrical communication with the first contacts 404 for allowing electrical communication between the integrated circuit package contacts 406 and the circuit board contacts. As an option, the first contacts 404 may be planar for engaging the integrated circuit package contacts 406. As shown, the body 402 may be configured to allow positioning of components between the integrated circuit package 408 and the circuit board 412 (e.g. components 414) about the outer periphery of the body 402. In various embodiments, the components may include passive components, active components, or a combination of passive and active components.

As noted above, in one embodiment, the first contacts 404 may be planar for engaging the integrated circuit package contacts 406. It should be noted, however, that the first contacts 404 may be any type of contacts which allow engagement of any type of integrated circuit package. In various embodiments, such contacts may include pads, balls, pins, slots, grooves, and/or any other type of contact for engaging integrated circuit package contacts.

It should also be noted that the number of contacts and/or rows of contacts may vary depending on the integrated circuit package to be engaged. In various embodiments, the first contacts 404 may comprise two or three rows of contacts. However, any number of rows may be utilized depending on the integrated circuit package to be engaged.

As noted above, in various embodiments, the second contacts 410 may include ball contacts for engaging the circuit board contacts or pin contacts for engaging the circuit board contacts. It should be noted that any types of contacts may be utilized depending on the circuit board to be engaged. In various embodiments, such contacts may include pads, balls, pins, slots, grooves, and/or any other type of contact for engaging circuit board contacts.

It should also be noted that the number of contacts and/or rows of contacts may vary depending on the circuit board to be engaged. In various embodiments, the second contacts 410 may comprise two or three rows of contacts. However, any number of rows may be utilized depending on the circuit board to be engaged.

Figure 5:
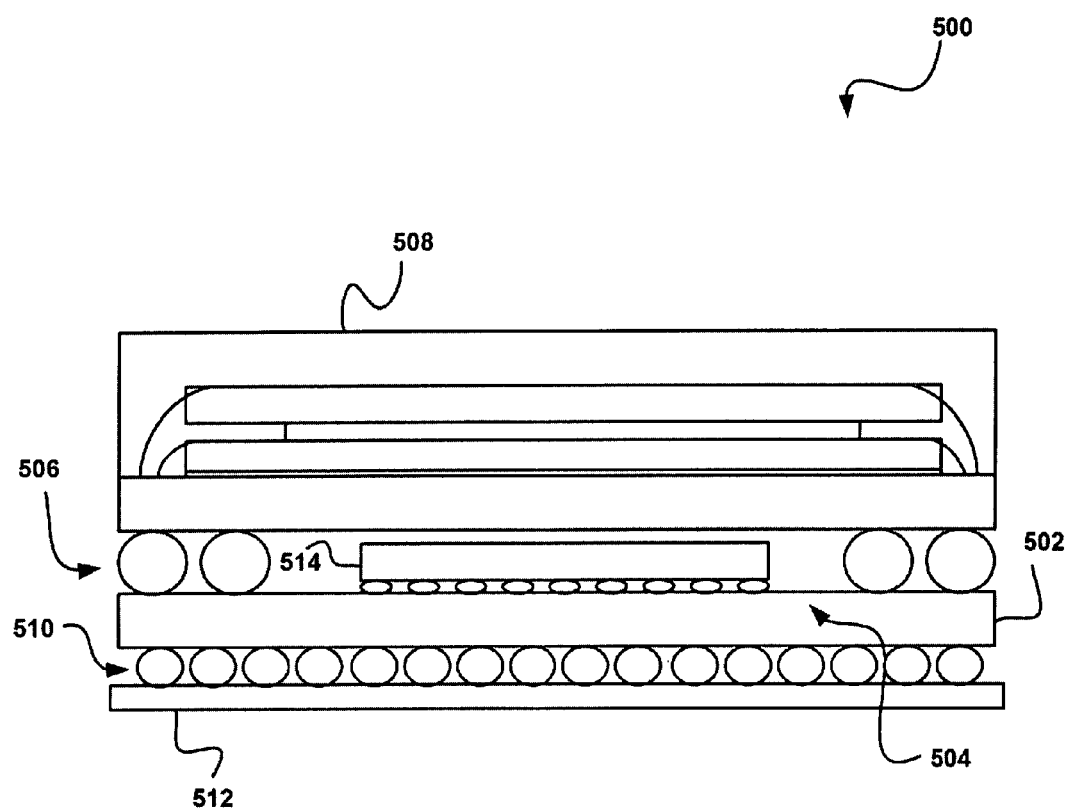
FIG. 5 shows an apparatus for electrical communication between integrated circuit package contacts of an integrated circuit package and circuit board contacts of a circuit board, in accordance with another embodiment.

FIG. 5 shows an apparatus 500 for electrical communication between integrated circuit package contacts of an integrated circuit and circuit board contacts of a circuit board, in accordance with another embodiment. While FIG. 5 sets forth one embodiment, the aforementioned definitions may equally apply to the description below.

As shown, a body 502 is provided. In one embodiment, the body 502 may be planar. In the illustrated embodiment, the body 502 may have a size similar to a size of an integrated circuit package 508.

Further, a plurality of first contacts 504 are provided. The first contacts 504 are positioned on a first side of the body 502 and configured for electrical communication with integrated circuit package contacts 506 of the integrated circuit package 508. In one embodiment, the integrated circuit package may include DRAM.

Additionally, a plurality of second contacts 510 are provided. The second contacts 510 are positioned on a second side of the body 502 and configured for electrical communication with circuit board contacts of a circuit board 512. In one embodiment, the second contacts 510 may include ball contacts for engaging the circuit board contacts. In another embodiment, the second contacts 510 may include pin contacts for engaging the circuit board contacts. In use, the second contacts 510 are in electrical communication with the first contacts 504 for allowing electrical communication between the integrated circuit package contacts 506 and the circuit board contacts.

As shown, the body 502 may be configured to allow positioning of a component 514 between the integrated circuit package 508 and the body 502. In such case, the first set of contacts 504 may be configured and augmented in number, etc. such that the component 514 or a plurality of the components 514 may be positioned on the first side of the body 502. Such first set of contacts 504 may further allow electrical communication between the contacts of the component 514 and those of the integrated circuit package 508 and/or the circuit board 512. In one embodiment, the component 514 may be a Flip-Chip™ component [e.g. a Ball Grid Array (BGA) controller]. In another embodiment, the component 514 may be wire-bonded component. In the context of the present description, a wire-bonded component may be any component which may be wire-bonded to a circuit board or any other suitable substrate, card, module, or object.

As noted above, in one embodiment, the first contacts 504 may be planar for engaging the integrated circuit package contacts 506. It should be noted, however, that the first contacts 504 may be any type of contacts which allow engagement of any type of integrated circuit or integrated circuit package. In various embodiments, such contacts may include pads, balls, pins, slots, grooves, and/or any other type of contact for engaging integrated circuit contacts or integrated circuit package contacts.

It should also be noted that the number of contacts and/or rows of contacts may vary depending on the integrated circuit package to be engaged. In various embodiments, the first contacts 504 may comprise two or three rows of contacts. However, any number of rows may be utilized depending on the integrated circuit package to be engaged.

As noted above, in various embodiments, the second contacts 510 may include ball contacts for engaging the circuit board contacts or pin contacts for engaging the circuit board contacts. It should be noted that any types of contacts may be utilized depending on the circuit board to be engaged. In various embodiments, such contacts may include pads, balls, pins, slots, grooves, and/or any other type of contact for engaging circuit board contacts.

It should also be noted that the number of contacts and/or rows of contacts may vary depending on the circuit board to be engaged. In various embodiments, the second contacts 510 may comprise two or three rows of contacts. However, any number of rows may be utilized depending on the circuit board to be engaged.

Figure 6:
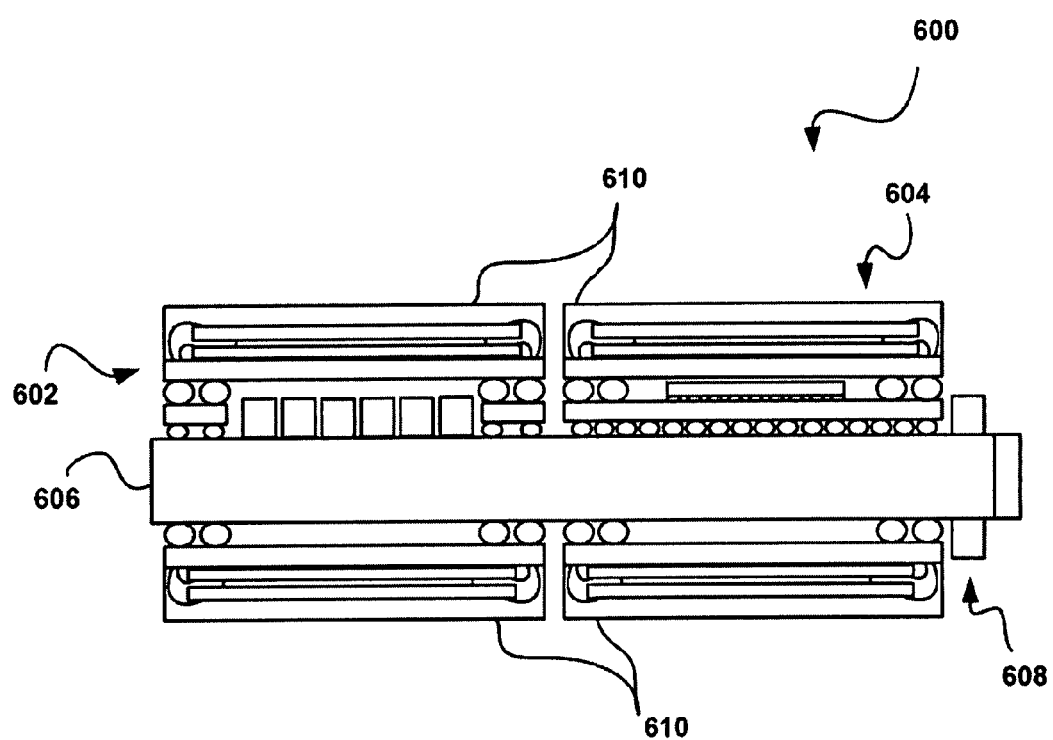
FIG. 6 shows a system comprising multiple apparatuses for electrical communication between integrated circuit package contacts of integrated circuit packages and circuit board contacts of a circuit board, in accordance with one embodiment.

FIG. 6 shows a system 600 comprising multiple apparatuses for electrical communication between integrated circuit package contacts of integrated circuit packages and circuit board contacts of a circuit board, in accordance with one embodiment. As an option, the system 600 may be implemented in the context of the details of FIGS. 1-5. Of course, however, the system 600 may be implemented in any desired environment. Further, the aforementioned definitions may equally apply to the description below.

As shown, a plurality of integrated circuit packages 610 are in electronic communication with a circuit board 606. On a first side of the circuit board 606, multiple apparatuses are used to connect the integrated circuit packages 610 with the circuit board 606. For example, a first apparatus 602 is provided for allowing a first integrated circuit package to communicate with the circuit board 606, while allowing a plurality of components to be positioned between the circuit board 606 and the first integrated circuit package. Such apparatus may be the apparatus as described in the context of the details of FIG. 1, for example.

Further, a second apparatus 604 is provided for allowing a second integrated circuit package to communicate with the circuit board 606, while allowing a component to be positioned between the circuit board 606 and the first integrated circuit package. Such apparatus may be the apparatus as described in FIG. 5, for example. As an option, the integrated circuit package may include DRAM. Additionally, the component may be a Flip-Chip™ component (e.g. a BGA controller).

As shown, additional integrated circuit packages are provided on a second side of the circuit board 606. Such integrated circuit packages may include additional DRAM, for example. It should be noted that the integrated circuit packages on the second side of the circuit board 606 are illustrated as interfacing directly with the circuit board 606. As shown further, additional components (e.g. see component 608) may be positioned on the circuit board 606 utilizing available space of the circuit board 606.

In another embodiment, the integrated circuit packages may interface with apparatuses such that additional components may be placed between the integrated circuit packages and the circuit board 606, similar to the apparatuses 602 and 604. More information regarding such an embodiment will be set forth during reference to FIG. 7.

Figure 7:
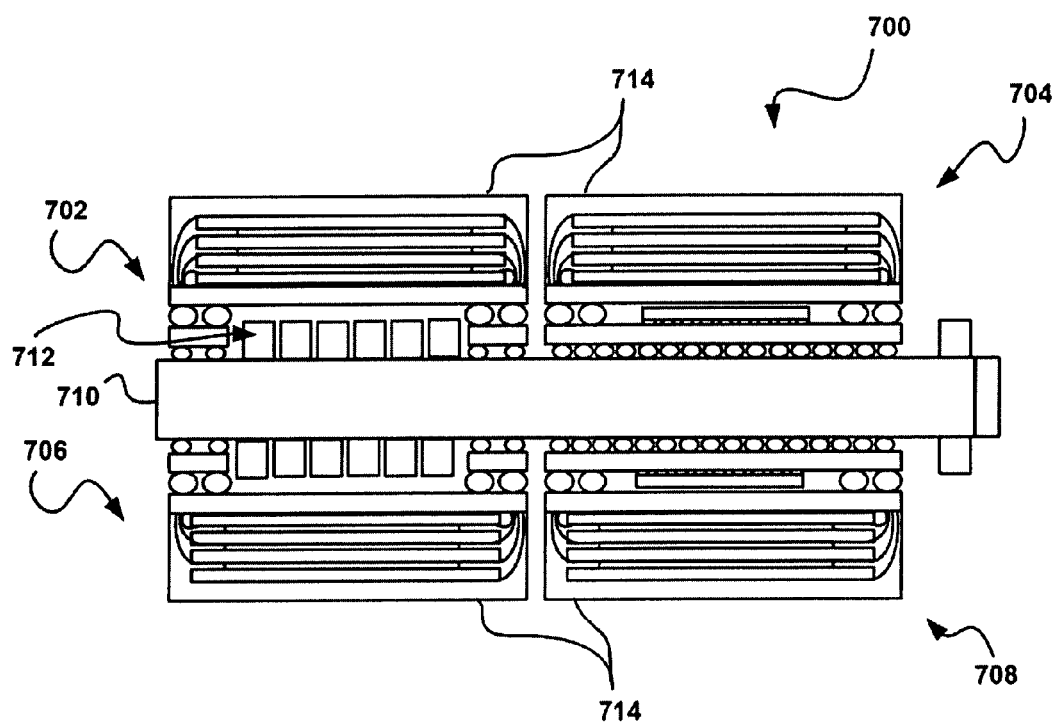
FIG. 7 shows a system comprising multiple apparatuses for electrical communication between integrated circuit package contacts of integrated circuit packages and circuit board contacts of a circuit board, in accordance with another embodiment.

FIG. 7 shows a system 700 comprising multiple apparatuses for electrical communication between integrated circuit package contacts of integrated circuit packages and circuit board contacts of a circuit board, in accordance with another embodiment. As an option, the system 700 may be implemented in the context of the details of FIGS. 1-5. Of course, however, the system 700 may be implemented in any desired environment. Further, the aforementioned definitions may equally apply to the description below.

As shown, a plurality of integrated circuit packages 714 are in electronic communication with a circuit board 710. On a first side of the circuit board 710, various apparatuses are used to connect the integrated circuit packages 714 with the circuit board 710. For example, a first apparatus 702 is provided for allowing a first integrated circuit package to communicate with the circuit board 710, while allowing a plurality of components to be positioned between the circuit board 710 and the first integrated circuit package. Such apparatus may be the apparatus as described in the context of the details of FIG. 1, for example.

Further, a second apparatus 704 is provided for allowing a second integrated circuit package to communicate with the circuit board 710, while allowing a component to be positioned between the circuit board 710 and the second integrated circuit package. Such apparatus may be the apparatus as described in the context of the details of FIG. 5, for example. As an option, the integrated circuit packages may include DRAM. Additionally, in one embodiment, the component may be a may be a Flip-Chip™ component (e.g. a BGA controller). In another embodiment, the component may be wire-bonded component.

In addition, on a second side of the circuit board 710, a third apparatus 706 is provided for allowing a third integrated circuit package to communicate with the circuit board 710, while allowing a plurality of components to be positioned between the circuit board 710 and the third integrated circuit package. Such apparatus may be the apparatus as described in the context of the details of FIG. 1, for example.

Further, a fourth apparatus 708 is provided for allowing a fourth integrated circuit package to communicate with the circuit board 710, while allowing a component to be positioned between the circuit board 710 and the fourth integrated circuit package. Such apparatus may be the apparatus as described in the context of the details of FIG. 5, for example. As shown further, additional components (e.g. see components 712) may be positioned on the circuit board 710 utilizing available space of the circuit board 710.

FIG. 8 is a top view of an apparatus 800 for electrical communication between integrated circuit package contacts of multiple integrated circuit packages and circuit board contacts of a circuit board, in accordance with one embodiment. It should be noted that the aforementioned definitions may apply during the present description.

As shown, a body 802 is provided. Further, a plurality of contacts 804 are provided. The contacts 804 are configured for electrical communication with integrated circuit package contacts of integrated circuit packages 806 and 808. Additionally, the contacts 804 and the body 802 are configured such that a plurality of components 810 may be positioned between the integrated circuit packages 806 and 808.

In one embodiment, the contacts 804 are in electrical communication with additional contacts on an opposite side of the body 802, which are in electrical communication with a circuit board. Thus, the apparatus 800 may allow for electrical communication between integrated circuit package contacts of the integrated circuit packages 806 and 808 and circuit board contacts of the circuit board.

FIG. 9 is a bottom view of an apparatus 900 for electrical communication between integrated circuit package contacts of an integrated circuit package and circuit board contacts of a circuit board, in accordance with another embodiment. As shown, a body 902 is provided. Further, a plurality of contacts 904 are provided. The contacts 904 are configured for electrical communication with circuit board contacts of a circuit board. In one embodiment, the contacts 904 may include ball contacts for engaging the circuit board contacts. In another embodiment, the contacts may include pin contacts for engaging the circuit board contacts.

Thus, FIG. 9 illustrates the bottom side of the body 802 shown in FIG. 8. In such case, the contacts 804 of FIG. 8 may be in electrical communication with the contacts 904 of FIG. 9 for allowing electrical communication between the integrated circuit packages 806 and 808 and the circuit board.

FIG. 10 shows a system 1000 comprising an apparatus for electrical communication between integrated circuit package contacts of integrated circuit packages and circuit board contacts of a circuit board, in accordance with one embodiment. As shown, an apparatus 1002 is shown to take the form of a frame which constitute a bottom portion of a body where such body further includes a top portion that confines the space. Specifically, on one side of a circuit board the apparatus 1002 is provided for allowing communication between multiple integrated circuit packages 1004 and a circuit board 1006.

In one embodiment, such apparatus 1002 may be the apparatus illustrated in FIG. 8, for example. As illustrated, the apparatus 1002 is configured such that components may be positioned between the integrated circuit packages 1004 while maintaining electrical communication to the circuit board 1006. Additionally, the apparatus 1002 is configured such that components (e.g. see component 1008) may be placed underneath the integrated circuit packages 1004 and on the circuit board 1006.

As shown further, additional integrated circuit packages are provided on a second side of the circuit board 1006. Such integrated circuit packages may include additional DRAM, for example. It should be noted that, while the integrated circuit packages on the second side of the circuit board 1006 are illustrated as interfacing directly with the circuit board 1006, the integrated circuit packages may interface with an apparatus such that additional components may be placed between the integrated circuit packages and the circuit board 1006, similar to the apparatus 1002. See FIG. 11, for example.

FIG. 11 shows a system 1100 comprising multiple apparatuses for electrical communication between integrated circuit package contacts of integrated circuit packages and circuit board contacts of a circuit board, in accordance with one embodiment. As an option, the system 1100 may be implemented in the context of the details of FIGS. 8 and 9. Of course, however, the system 1100 may be implemented in any desired environment. Further, the aforementioned definitions may equally apply to the description below.

As shown, on a first side of a circuit board, an apparatus 1'102 is provided for allowing communication between multiple integrated circuit packages 1104 and a circuit board 1106. In one embodiment, such apparatus 1102 may be the apparatus illustrated in FIG. 8, for example. As illustrated, the apparatus 1102 is configured such that components may be positioned between the integrated circuit packages 1104 while maintaining electrical communication to the circuit board 1106. Additionally, the apparatus 1102 is positioned such that components (e.g. see component 1108) may be placed between the integrated circuit packages 1104 and the circuit board 1106.

As further shown, on a second side of a circuit board, an apparatus 1110 is provided for allowing communication between multiple integrated circuit packages 1112 and the circuit board 1106. In one embodiment, such apparatus 1110 may be the apparatus illustrated in FIG. 8, for example. As illustrated, the apparatus 1110 is configured such that components may be positioned between the integrated circuit packages 1112 while maintaining electrical communication to the circuit board 1106. Additionally, the apparatus 1110 is positioned such that components (e.g. see component 1114) may be placed between the integrated circuit packages 1112 and the circuit board 1106.

FIG. 12 is a top view of a system 1200 comprising multiple apparatuses for electrical communication between integrated circuit package contacts of integrated circuit packages and circuit board contacts of a circuit board, in accordance with another embodiment. As an option, the system 1200 may be implemented in the context of the details of FIGS. 8 and 9. Of course, however, the system 1200 may be implemented in any desired environment. Further, the aforementioned definitions may equally apply to the description below.

As shown, a plurality of integrated circuit packages 1202 are in communication with a circuit board 1204. Such communication may be established utilizing the apparatus illustrated in FIG. 8, for example. Thus, multiple apparatuses may be utilized to provide communication between the plurality of integrated circuit packages and 1202 and the circuit board 1204.

Figure 13:
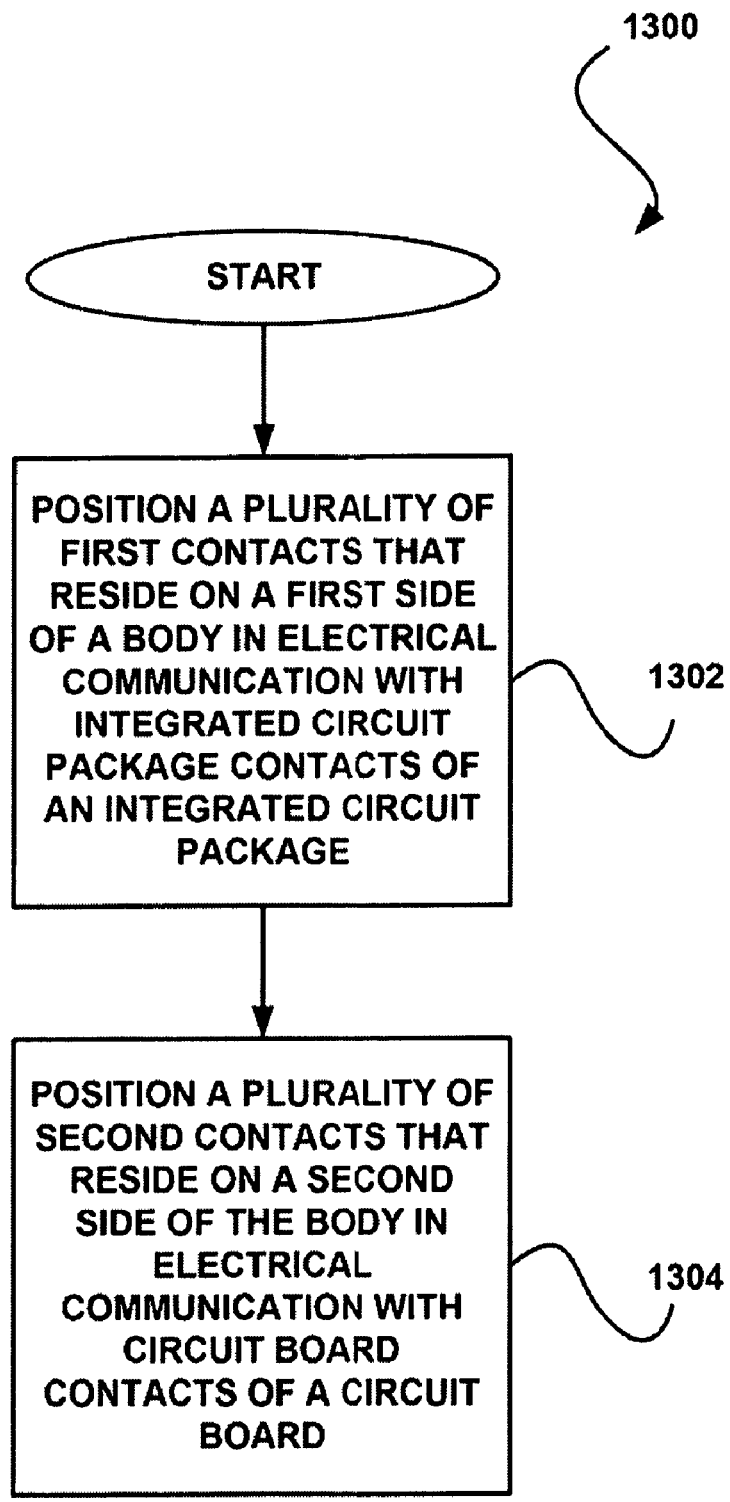
FIG. 13 shows a method for allowing electrical communication between integrated circuit package contacts and circuit board contacts, in accordance with one embodiment.

FIG. 13 shows a method 1300 for allowing electrical communication between integrated circuit package contacts and circuit board contacts, in accordance with one embodiment. As an option, the method 1300 may be implemented in the context of the details of FIGS. 1-12. Of course, however, the method 1300 may be carried out in any desired environment. Further, the aforementioned definitions may equally apply to the description below.

As shown in operation 1300, a plurality of first contacts that reside on a first side of a body are positioned in electrical communication with integrated circuit package contacts of an integrated circuit package. In operation 1304, a plurality of second contacts that reside on a second side of the body are positioned in electrical communication with circuit board contacts of a circuit board. In use, the second contacts are in electrical communication with the first contacts for allowing electrical communication between the integrated circuit package contacts and the circuit board contacts.

Figure 14:
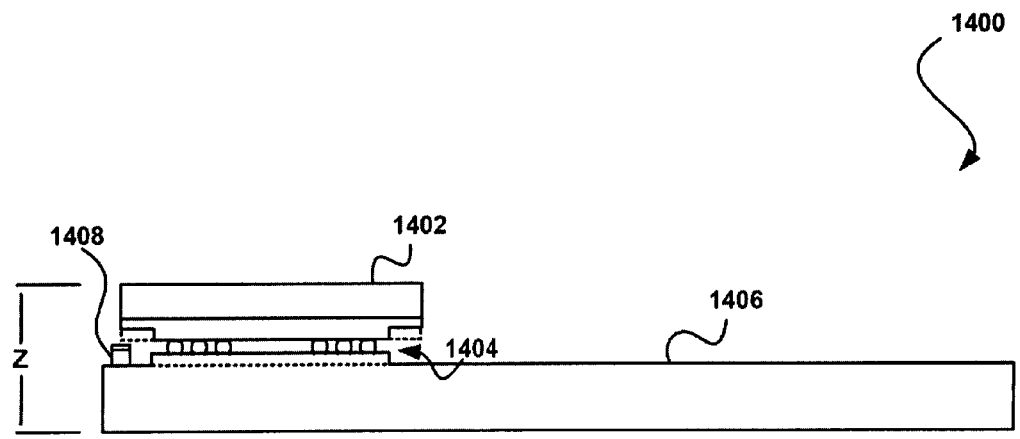
FIG. 14 shows a system for providing additional space between an integrated circuit package and a circuit board for positioning at least a portion of at least one component therebetween, in accordance with one embodiment.

FIG. 14 shows a system 1400 for providing additional space between an integrated circuit package and a circuit board for positioning at least a portion of at least one component therebetween, in accordance with one embodiment. As an option, the system 1400 may be implemented in the context of the details of FIGS. 1-13. Of course, however, the system 1400 may be implemented in any desired environment. Further, the aforementioned definitions may equally apply to the description below.

As shown, an integrated circuit package 1402 is provided, including a plurality of integrated circuit package contacts 1404. Additionally, a circuit board 1406 is provided in electrical communication with the integrated circuit package 1402.

Further, the integrated circuit package 1402, the integrated circuit package contacts 1404, and/or the circuit board 1406 may configured for providing additional space between the integrated circuit package 1402 and the circuit board 1406 for positioning at least a portion of at least one component 1408 between the integrated circuit package 1402 and the circuit board 1406. In one embodiment, the integrated circuit package 1402, the integrated circuit package contacts 1404, and the circuit board 1406 may all be configured for providing such additional space between the integrated circuit package 1402 and the circuit board 1406. In various embodiments, the component 1408 may include a passive component, an active component, or a combination of passive and active components.

It should be noted that any of the integrated circuit package 1402, the integrated circuit package contacts 1404, and/or the circuit board 1406 may be configured to allow for components of various sizes to be positioned between the integrated circuit package 1402 and the circuit board 1406. In such case, the total profile (Z) may vary depending on the component 1408 to be placed between the integrated circuit package 1402 and the circuit board 1406. In one embodiment, the total profile (Z) may be a fixed maximum allowable height. In such case, the integrated circuit package 1402, the integrated circuit package contacts 1404, and/or the circuit board 1406 may be configured to allow for additional space, while, at the same time, staying under the maximum profile (Z).

In one embodiment, the integrated circuit package 1402 may include memory (e.g. DRAM, etc.). Of course, however, other types of integrated circuit packages or integrated circuits (e.g. flash memory, controllers, processors, etc.) are also contemplated. Further, in various other embodiments, the integrated circuit package 1402 may be used in a computer system, cellular phone, personal digital assistant (PDA), digital camera, digital video recorder, global positioning system (GPS), and any other electrical device which uses integrated circuits.

In one embodiment, the integrated circuit package contacts 1404 may include ball contacts for engaging circuit board contacts (not shown) of the circuit board 1406. In another embodiment, the integrated circuit package contacts 1404 may include pin contacts for engaging the circuit board contacts of the circuit board 1406. It should be noted, however, that any types of contacts may be utilized depending on the circuit board to be engaged. In various embodiments, such contacts may include pads, balls, pins, slots, grooves, and/or any other type of contact for engaging circuit board contacts.

More illustrative information will now be set forth regarding various optional architectures and features with which the foregoing framework of FIG. 14 may or may not be implemented, per the desires of the user. It should be strongly noted that the following information is set forth for illustrative purposes and should not be construed as limiting in any manner. Any of the following features may be optionally incorporated with or without the exclusion of other features described.

Figure 15:
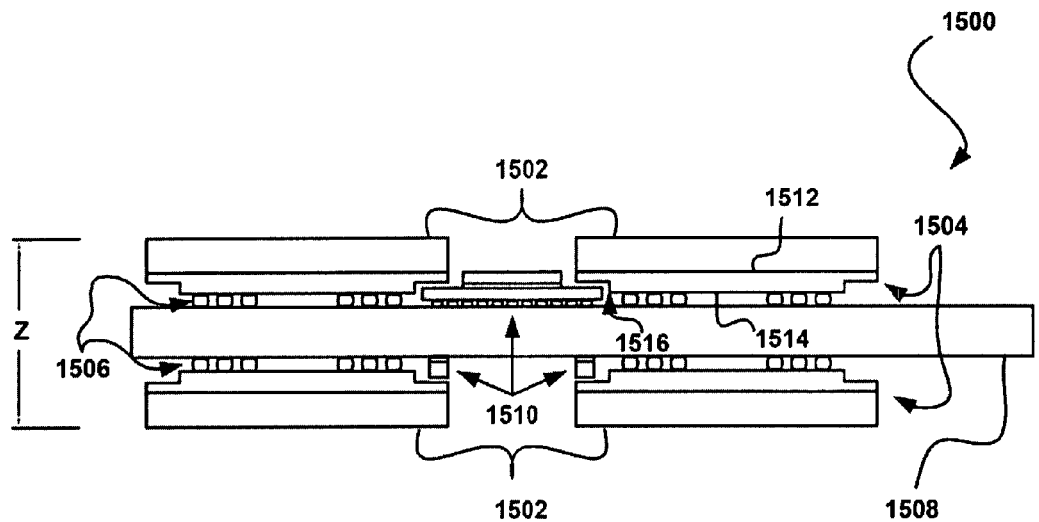
FIG. 15 shows a system for providing additional space between an integrated circuit package and a circuit board for positioning at least a portion of at least one component therebetween, in accordance with another embodiment.

FIG. 15 shows a system 1500 for providing additional space between an integrated circuit package and a circuit board for positioning at least a portion of at least one component therebetween, in accordance with another embodiment. As an option, the system 1500 may be implemented in the context of the details of FIG. 14. Of course, however, the system 1500 may be implemented in any desired environment. Further, the aforementioned definitions may equally apply to the description below.

As shown, a plurality of integrated circuit packages 1502 are provided, including a plurality of integrated circuit package contacts 1506. Further provided is a circuit board 1508 in electrical communication with the integrated circuit packages 1502. As shown, a lower portion 1504 of the integrated circuit packages 1502 is configured for providing additional space between the integrated circuit packages 1502 and the circuit board 1508 for positioning at least a portion of at least one component 1510 between at least one of the integrated circuit packages 1502 and the circuit board 1508.

In the current embodiment, the integrated circuit packages 1502 include a bottom face 1514 with a recess 1516 formed therein. In one embodiment, the recess 1516 may be formed about a periphery of the integrated circuit packages 1502. Such configuration may be utilized to provide additional space between the integrated circuit packages 1502 and the circuit board 1508.

In another embodiment, the recess 1516 may be formed around the plurality of integrated circuit package contacts 1506 of the integrated circuit package 1502. In still another embodiment, at least a portion of at least one of the components 1510 may be coupled to the circuit board 1508 underneath, at least in part, the recess 1516 of at least one of the integrated circuit packages 1502. Such components 1510 may include passive components, active components, or a combination of passive and active components. Furthermore, in one embodiment, the integrated circuit packages 1502 may include memory (e.g. DRAM, etc.). Of course, however, other types of integrated circuit packages and/or integrated circuits (e.g. flash memory, controllers, processors, etc.) are also contemplated.

It should be noted that forming the recess 1516 on the bottom face 1514 of the integrated circuit packages 1502 allows at least a portion of at least one of the components 1510 to be positioned under the integrated circuit packages 1502 without the use of additional contacts other than the integrated circuit package contacts 1506. Furthermore, in various embodiments, the recess 1516 may include any number of recess layers. For example, in one embodiment, the recess 1516 may include a tiered configuration.

Figure 16:
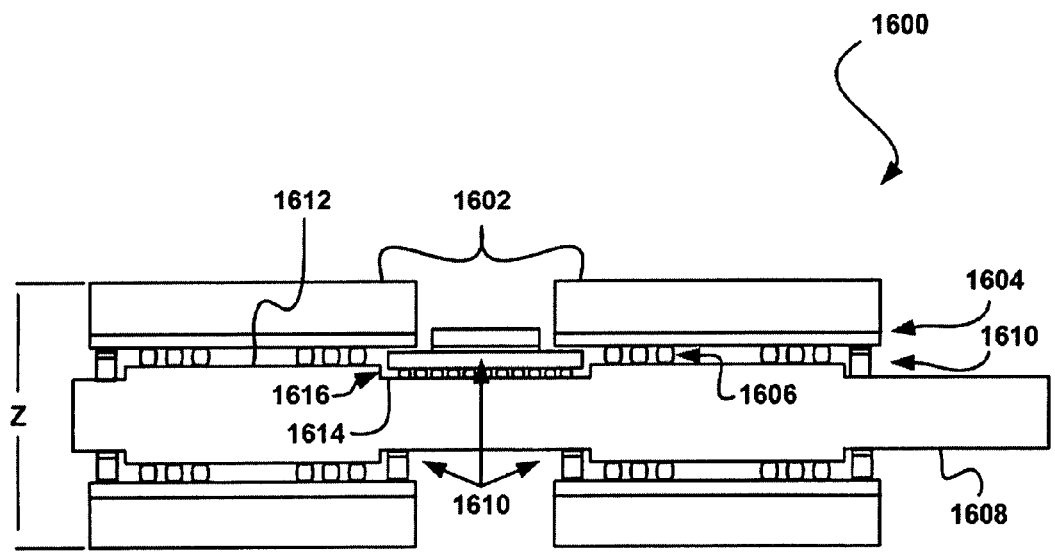
FIG. 16 shows a system for providing additional space between an integrated circuit package and a circuit board for positioning at least a portion of at least one component therebetween, in accordance with yet another embodiment.

FIG. 16 shows a system 1600 for providing additional space between an integrated circuit package and a circuit board for positioning at least a portion of at least one component therebetween, in accordance with another embodiment. As an option, the system 1600 may be implemented in the context of the details of FIGS. 1-15. Of course, however, the system 1600 may be implemented in any desired environment. Further, the aforementioned definitions may equally apply to the description below.

As shown, a plurality of integrated circuits 1602, including a lower portion 1604 of the integrated circuit packages 1602 and a plurality of integrated circuit package contacts 1606 are provided. Further provided is a circuit board 1608 in electrical communication with the integrated circuit packages 1602. As shown, the circuit board 1608 is configured for providing additional space between at least one of the integrated circuit packages 1602 and the circuit board 1608 for positioning at least a portion of at least one component 1610 between the integrated circuit packages 1602 and the circuit board 1608.

As shown, the circuit board 1608 includes a top face 1612 with a recess 1616 formed therein. In one embodiment, the recess 1616 may be formed around a plurality of circuit board contacts (not shown) of the circuit board 1608. In another embodiment, the recess 1616 may be formed in the circuit board 1608 around the integrated circuit package contacts 1606 of the integrated circuit packages 1602 in a manner that circumnavigates the integrated circuit package contacts 1606. Additionally, in one embodiment, at least a portion of at least one of the components 1610 may be coupled to the circuit board 1608 underneath, in the recess 1616.

In one embodiment, the recess 1616 may be formed by adding material to the circuit board 1608. In another embodiment, the recess 1616 may be formed by removing material from the circuit board 1608. In this case, the circuit board 1608 may include cut-outs or cavities to form the recess 1616.

In one embodiment, the plurality of circuit board contacts may be planar for engaging the integrated circuit package contacts 1606. It should be noted, however, that the circuit board contacts may be any type of contacts which allow engagement of any type of integrated circuit or integrated circuit package. In various embodiments, such contacts may include pads, balls, pins, slots, grooves, and/or any other type of contact for engaging integrated circuit contacts or integrated circuit package contacts.

It should be noted that forming the recess 1616 on the top face 1612 of the circuit board 1608 allows at least a portion of at least one of the components 1610 to be positioned under the integrated circuit packages 1602 without the use of additional contacts other than the integrated circuit package contacts 1606. Furthermore, in various embodiments, the recess 1616 may include any number of recess layers. For example, in one embodiment, the recess 1616 may include a tiered configuration.

In one embodiment, adjacent recesses in the circuit board may allow for positioning of components between the adjacent recesses and beneath at least one integrated circuit package. This technique and other similar techniques are further described in the related application Ser. No. 11/588,739, which has been incorporated by reference in its entirety.

Figure 17:
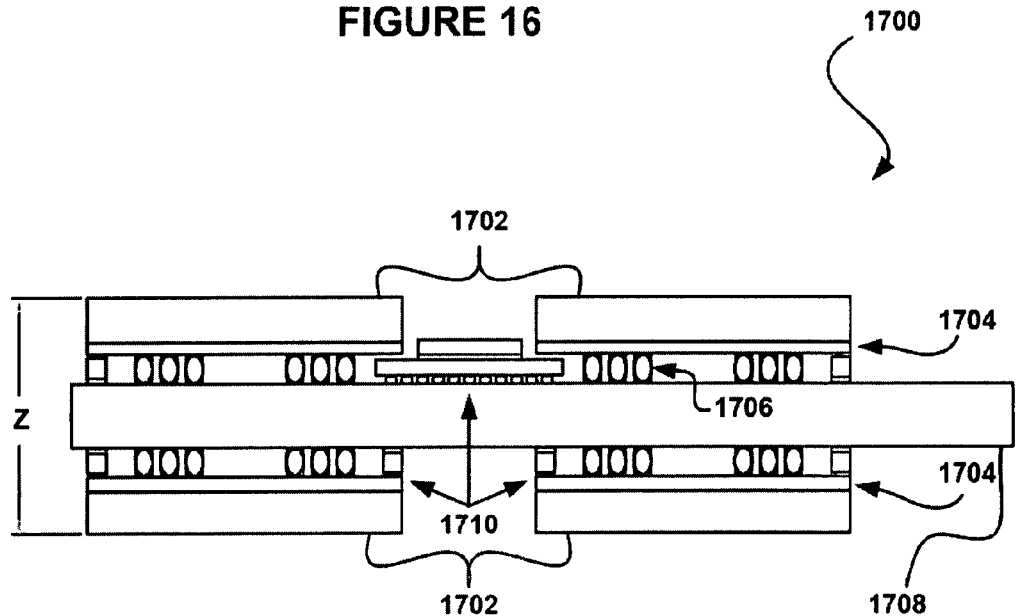
FIG. 17 shows a system for providing additional space between an integrated circuit package and a circuit board for positioning at least a portion of at least one component therebetween, in accordance with still yet another embodiment.

FIG. 17 shows a system 1700 for providing additional space between an integrated circuit package and a circuit board for positioning at least a portion of at least one component therebetween, in accordance with another embodiment. As an option, the system 1700 may be implemented in the context of the details of FIGS. 14-16. Of course, however, the system 1700 may be implemented in any desired environment. Further, the aforementioned definitions may equally apply to the description below.

As shown, a plurality of integrated circuit packages 1702 including a lower portion 1704 of the integrated circuit packages 1702 and a plurality of integrated circuit package contacts 1706 are provided. Further provided is a circuit board 1708 in electrical communication with the integrated circuit packages 1702. As further shown, the integrated circuit package contacts 1706 are configured for providing additional space between the plurality of integrated circuit packages 1702 and the circuit board 1708 for positioning at least a portion of at least one component 1710 between the plurality of integrated circuit packages 1702 and the circuit board 1708.

In one embodiment, the integrated circuit package contacts 1706 may be sized for providing the additional space between the integrated circuit packages 1702 and the circuit board 1708. In such case, the sizing may depend on the type and/or size of the component 1710 to be placed between the integrated circuit package 1702 and the circuit board 1708. For example, a height of the integrated circuit package contacts 1706 may be sized to match a full height of the component 1710 with optionally an additional 2%-10% of height for providing a small space between the integrated circuit packages 1702 and the component 1710, as shown.

Further, as shown, the integrated circuit package contacts 1706 may include ball contacts for engaging circuit board contacts (not shown) of the circuit board 1708. In another embodiment, the integrated circuit package contacts 1706 may include pin contacts for engaging the circuit board contacts of the circuit board 1708.

Figure 18:
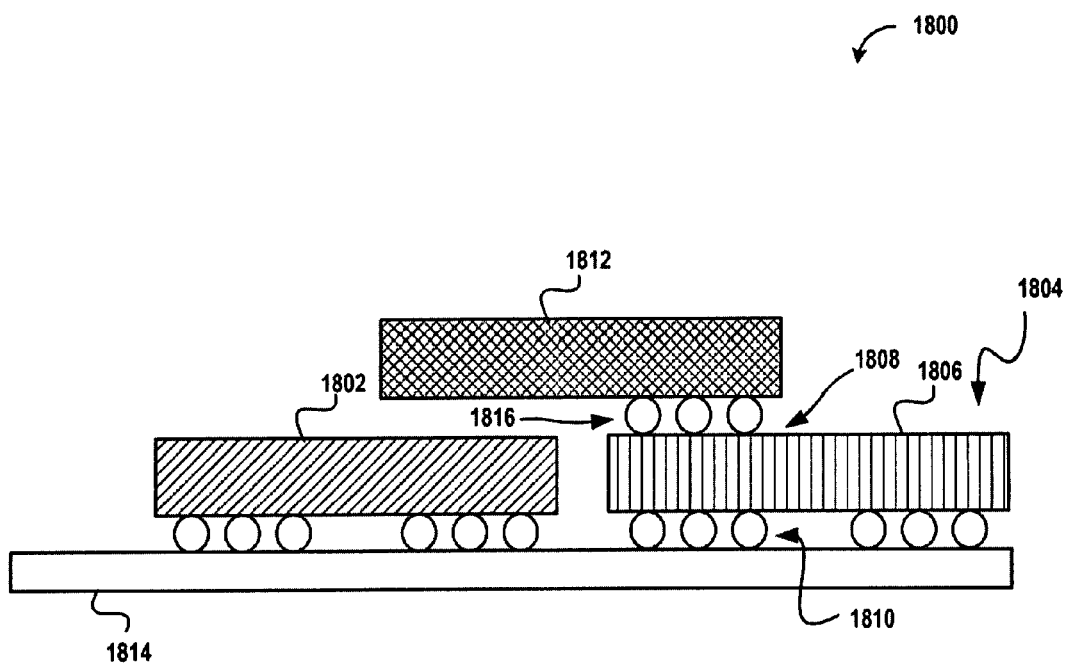
FIG. 18 shows a system for providing additional space between an integrated circuit package and a circuit board for positioning at least a portion of at least one component therebetween, in accordance with another embodiment.

FIG. 18 shows a system 1800 for providing additional space between an integrated circuit package and a circuit board for positioning at least a portion of at least one component therebetween, in accordance with another embodiment. As an option, the system 1800 may be implemented in the context of the details of FIGS. 1-17. Of course, however, the system 1800 may be implemented in any desired environment. Further, the aforementioned definitions may equally apply to the description below.

As shown, a first integrated circuit package 1802 is provided. Additionally, an apparatus 1804 is provided which includes a body 1806, a first set of contacts 1808, and a second set of contacts 1810. Furthermore, a second integrated circuit package 1812 is provided.

As shown, the second integrated package 1812 is in electrical communication with a circuit board 1814, via the apparatus 1804. In operation, contacts 1816 of the second integrated package 1812 are in electrical communication with the first set of contacts 1808 of the apparatus 1804. The first set of contacts 1808 are in electrical communication with the second set of contacts 1810, allowing for electrical communication between the second integrated circuit package 1812 and the circuit board 1814.

As shown further, the apparatus 1804 is configured to allow positioning of at least a portion of the first integrated circuit package 1802 between the second integrated circuit package 1812 and the circuit board 1814. In another embodiment, the first integrated circuit package 1802 may represent various other components (e.g. passive components, active components, chip sets, etc.).

In some situations, space on a circuit board may be limited. One way to utilize available space is to place components (or integrated circuit packages), or portions of components, over other components. In other words, the components may form a vertical stack (i.e. in the Z-direction). The apparatus 1804 may be mounted to any substrate or circuit board such that the vertical stack may be formed.

In one embodiment, the placement of the first set of contacts 1808 (e.g. solder balls, BOA contacts, wirebond contacts, contacts formed by tape automatic bonding (TAB), etc.) may be translated to one side of the top of the body 1806. Additionally, the contacts 1816 of the component to be mounted (e.g. the second integrated circuit package 1812) may also be translated laterally, thus permitting at least a portion of the component to be situated over another component (e.g. the first integrated circuit package 1802).

Figure 19:
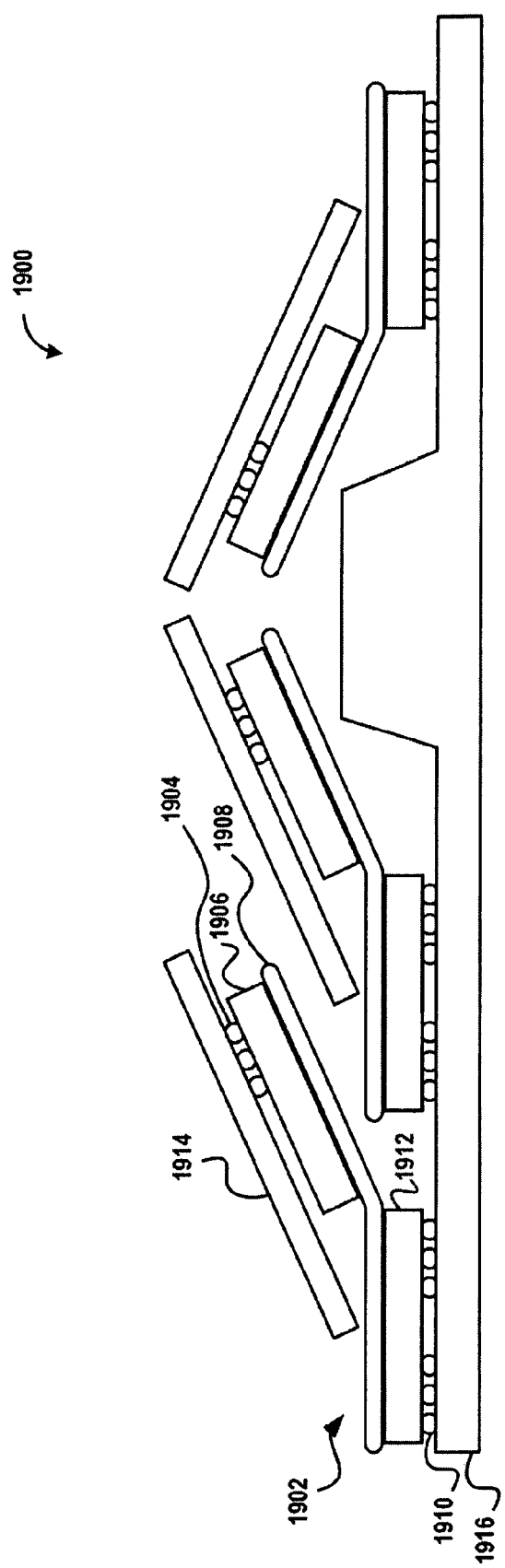
FIG. 19 shows a system for providing additional space between an integrated circuit package and a circuit board for positioning at least a portion of at least one component therebetween, in accordance with another embodiment.

FIG. 19 shows a system 1900 for providing additional space between an integrated circuit package and a circuit board for positioning at least a portion of at least one component therebetween, in accordance with another embodiment. As an option, the system 1900 may be implemented in the context of the details of FIGS. 1-18. Of course, however, the system 1900 may be implemented in any desired environment. Further, the aforementioned definitions may equally apply to the description below.

As shown, an apparatus 1902 is provided for allowing electrical communication between an integrated circuit package 1914 and a circuit board 1916. In operation, electrical connectivity on a top side of the apparatus 1902 is provided by a first set of contacts 1904 (e.g. solder balls, etc.), the first set of contacts 1904 being positioned on a first side of a first rigid material 1906. Additionally, a second side of the first rigid material 1906 is in electrical communication with a first end of a flexible portion 1908.

A second end of the flexible portion 1908 is in electrical communication with a first side of a second rigid material 1912. Additionally, a second set of contacts 1910 (e.g. solder balls, etc.), positioned on a second side of the second rigid material 1912, allows for electrical communication with the circuit board 1916. Furthermore, the apparatus 1902 allows for the positioning of components or integrated circuit packages between the integrated circuit package 1914 and the circuit board 1916. It should be noted that the flexible portion 1908 may be configurable such that different components may be positioned between the integrated circuit package 1914 and the circuit board 1916. As an option, the apparatus 1804 of FIG. 18 may be utilized in conjunction with the apparatus 1902 and the system 1900.

Figure 20:
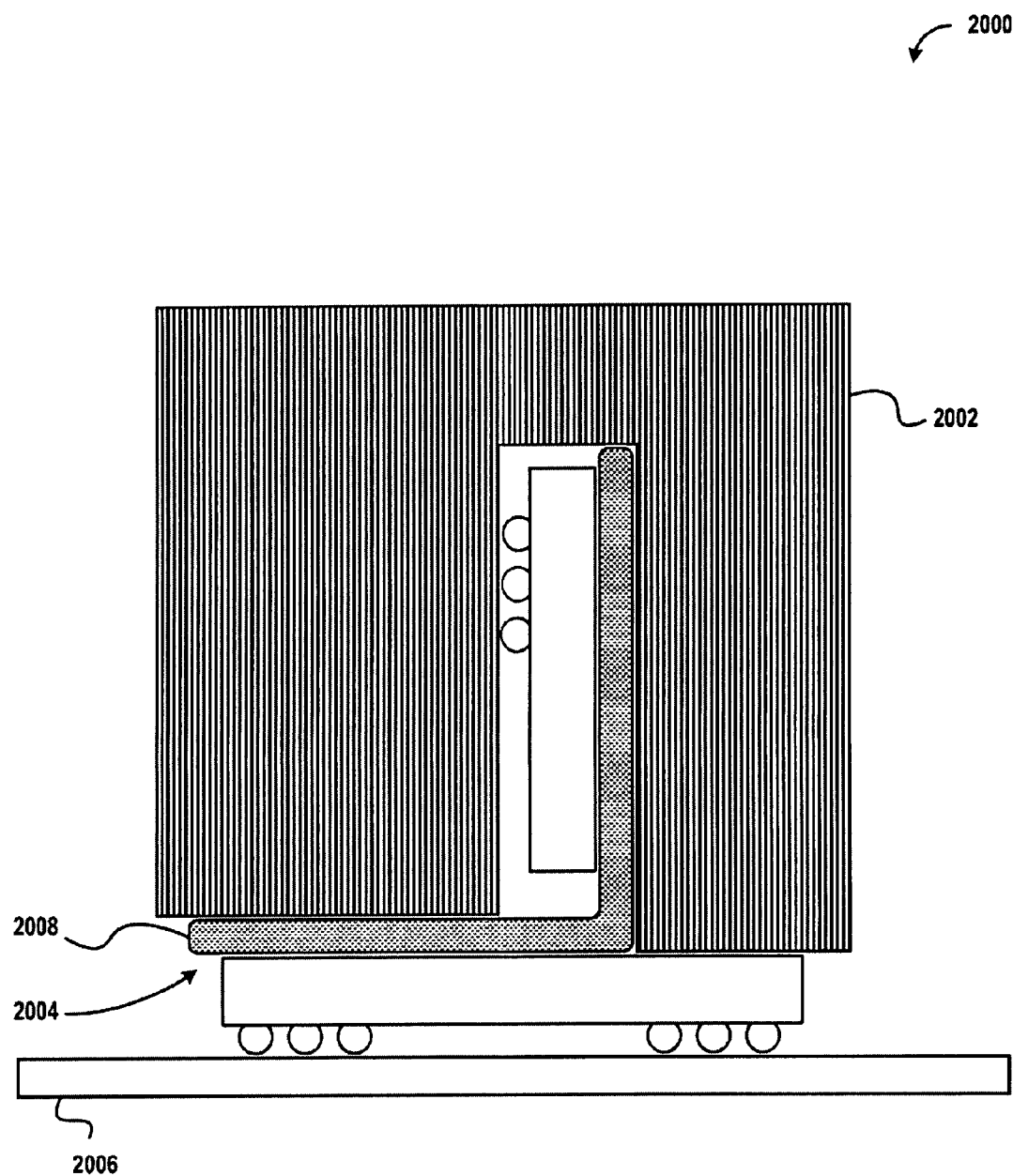
FIG. 20 shows a system for mounting an apparatus to a circuit board, in accordance with one embodiment.

FIG. 20 shows a system 2000 for mounting an apparatus to a circuit board, in accordance with one embodiment. As an option, the system 2000 may be implemented in the context of the details of FIGS. 1-19. Of course, however, the system 2000 may be implemented in any desired environment. Further, the aforementioned definitions may equally apply to the description below.

As shown, a structure 2002 is provided for providing force on an apparatus 2004 in order to mount the apparatus 2004 on a substrate or a circuit board 2006. In this case, a downward force on the apparatus 2004 may be uniform throughout a solder flow process used to mount the apparatus 2004 to the circuit board 2006. As shown further, the structure 2002 may be configured such that a lower portion of the structure 2002 is flush with all of an upper portion of the apparatus 2004.

In addition, the structure 2002 may be configured such that a flexible portion 2008 of the apparatus 2004 may be restricted from movement. In one embodiment, movement may be restricted by fitting at least a part of the flexible portion 2008 in a slot or recess formed in the structure 2002. As an option, the structure 2002 may be used to mount the apparatus 1902 of FIG. 19 to the circuit board 2006.

In one embodiment, the apparatus 2004 may be pre-assembled package including an integrated circuit package (e.g. DRAM, or a "hat shaped" DRAM package, etc.) that allows the integrated circuit package to overhang another integrated circuit package (e.g. buffer chips, etc.). In this case, if the center of mass of the assembly is not centered on a BGA that may connect the integrated circuit package (e.g. DRAM) to a DIMM, assembly issues may arise due to an uneven collapse of solder balls in the BGA. Thus, a structure may be used to add a counterweight to the apparatus and integrated circuit package (e.g. the apparatus and DRAM) during the assembly process to maintain the center of mass within an acceptable distance to the center of the BGA.

In one embodiment, the structure may include a breakaway portion of the apparatus. As an option, the breakaway portion may include an additional weight. In this case, the breakaway portion may protrude off the edge of the DIMM to avoid interference with other components during assembly. In another embodiment, the structure may include a separate piece of metal or plastic attached by mechanical retention clips or adhesive. It should be noted that the uneven collapse of solder balls in the BGA may be avoided by assembling the apparatus to the DIMM as a separate step, prior to assembling the integrated circuit package to the DIMM.

Figure 21:
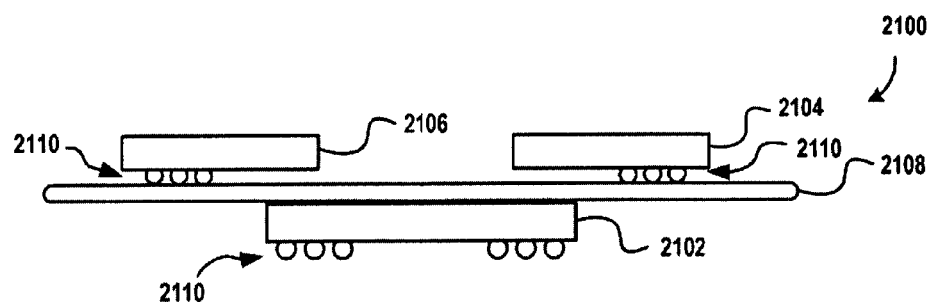
FIG. 21 shows an apparatus for providing additional space between an integrated circuit package and a circuit board for positioning at least a portion of at least one component therebetween, in accordance with another embodiment.

FIG. 21 shows an apparatus 2100 for providing additional space between an integrated circuit package and a circuit board for positioning at least a portion of at least one component therebetween, in accordance with another embodiment. As an option, the system 2100 may be implemented in the context of the details of FIGS. 1-20. Of course, however, the system 2100 may be implemented in any desired environment. Further, the aforementioned definitions may equally apply to the description below.

As shown, an apparatus 2100 is provided, including a first rigid body 2102, a second rigid body 2104, a third rigid body 2106, and a flexible body 2108. In operation, the apparatus 2100 allows for electrical communication between a circuit board (not shown), and at least one component or integrated circuit package (not shown), which may be positioned on a top side of the second rigid body 2104 and the third rigid body 2106.

In one embodiment, the flexible body 2108 may be laminated to the rigid bodies 2102-2106. In another embodiment, the flexible body 2108 may be mechanically connected to the rigid bodies 2102-2106 using standard drilled and plated through-holes. In this case, the drilled and plated through-holes may connect from the flexible body 2108 through the rigid bodies 2102-2106 to a plurality of electrical contacts 2110 (e.g. solder balls, etc.)

In still another embodiment, the flexible body 2108 may be connected to the rigid bodies 2102-2106, or directly to a circuit board, by "stripping" a portion of conductors (e.g. the last 50 mils) and using the exposed conductor ends as leads. As another option, one or two lines of staggered rectangular pads may be created which allow the flexible body 2108 to be soldered to the rigid bodies 2102-2106 or directly to a circuit board. This may be accomplished similar to soldering a BGA but with relaxed planarity requirements.

It should be noted that, although the apparatus 2100 is illustrated with the second rigid body 2104 and the third rigid body 2106 positioned on a top side of the flexible body 2108, the flexible body 2108 may be configured to allow for one rigid body. For example, a first end of the flexible body 2108 may extend past the first rigid body 2102 allowing for positioning of the second rigid body 2104, and a second end of the flexible body 2108 may be limited to the extent of the first rigid body 2102 such that the third rigid body 2106 is not positioned on the flexible body 2108. Furthermore, the flexible body 2108 may be configured from any suitable flexible material (e.g. flexible FR-4). Similarly, the rigid bodies 2102-2106 may be configured from any suitable rigid material (e.g. standard FR-4).

Figure 22:
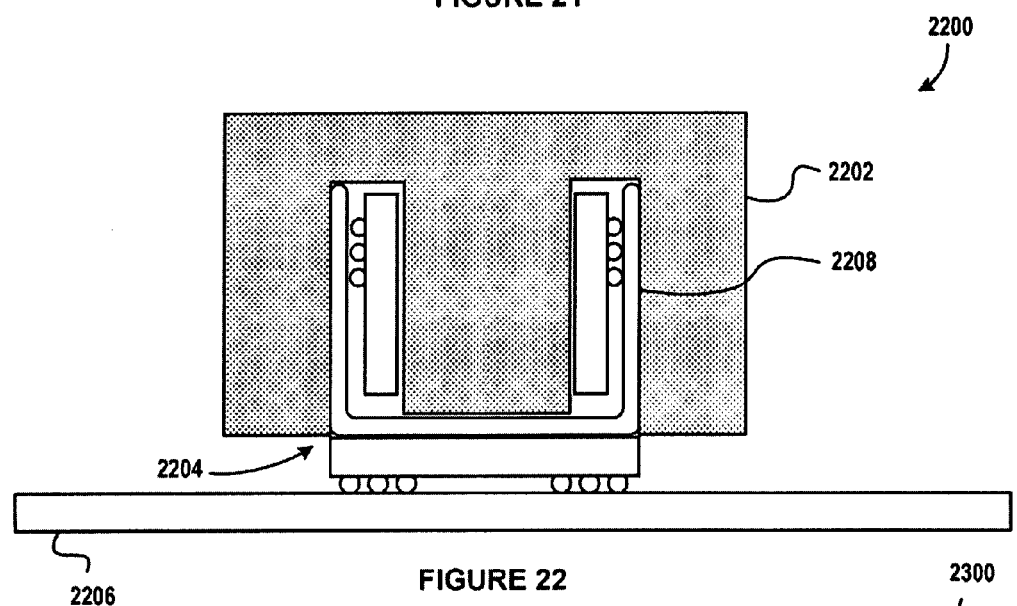
FIG. 22 shows a system for mounting an apparatus to a circuit board, in accordance with another embodiment.

FIG. 22 shows a system 2200 for mounting an apparatus to a circuit board, in accordance with another embodiment. As an option, the system 2200 may be implemented in the context of the details of FIGS. 1-21. Of course, however, the system 2200 may be implemented in any desired environment. Further, the aforementioned definitions may equally apply to the description below.

As shown, a structure 2202 is provided for providing force on an apparatus 2204 in order to mount the apparatus 2204 on a substrate or a circuit board 2206. In this case, a downward force on the apparatus 2204 may be uniform throughout a solder flow process used to mount the apparatus 2204 to the circuit board 2206. As shown further, the structure 2202 may be configured such that a lower portion of the structure 2202 is flush with all of an upper portion of the apparatus 2204.

In addition, the structure 2202 may be configured such that a flexible portion 2208 of the apparatus 2204 may be restricted from movement. In one embodiment, movement may be restricted by fitting at least a part of the flexible portion 2208 in a slot or recess formed in the structure 2202. As an option, the structure 2202 may be used to mount the apparatus 2100 of FIG. 21 to the circuit board 2206.

Figure 23:
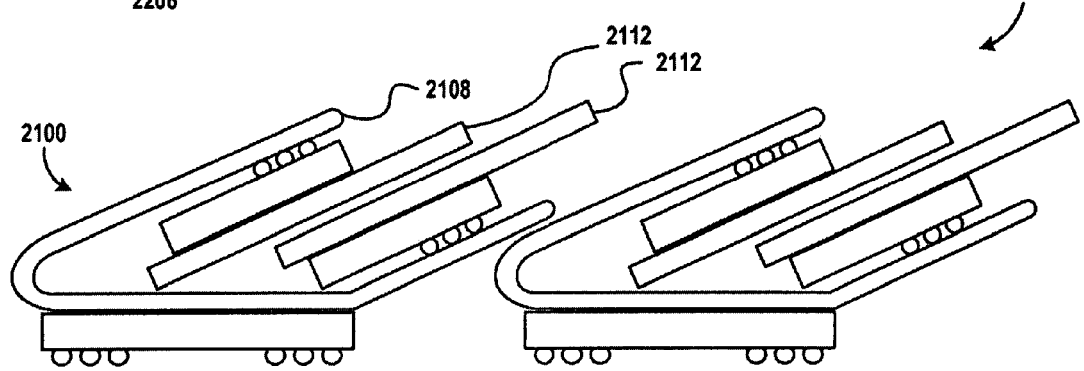
FIG. 23 shows a possible implementation of the apparatus of FIG. 21, in accordance with one embodiment.

FIG. 23 shows a possible implementation 2300 of the apparatus 2100 of FIG. 21, in accordance with one embodiment. It should be noted that the aforementioned definitions may equally apply to the description below.

As shown, the apparatus 2100 is configured such that integrated circuit packages 2112 or components may be efficiently positioned, utilizing available space. The flexible body 2108 may be configured and/or adjusted such that more that one apparatus 2100 may be adjacently positioned. This allows for a plurality of integrated circuit packages 2112 or components to be placed in a tiered, side-by-side manner.

Figure 24:
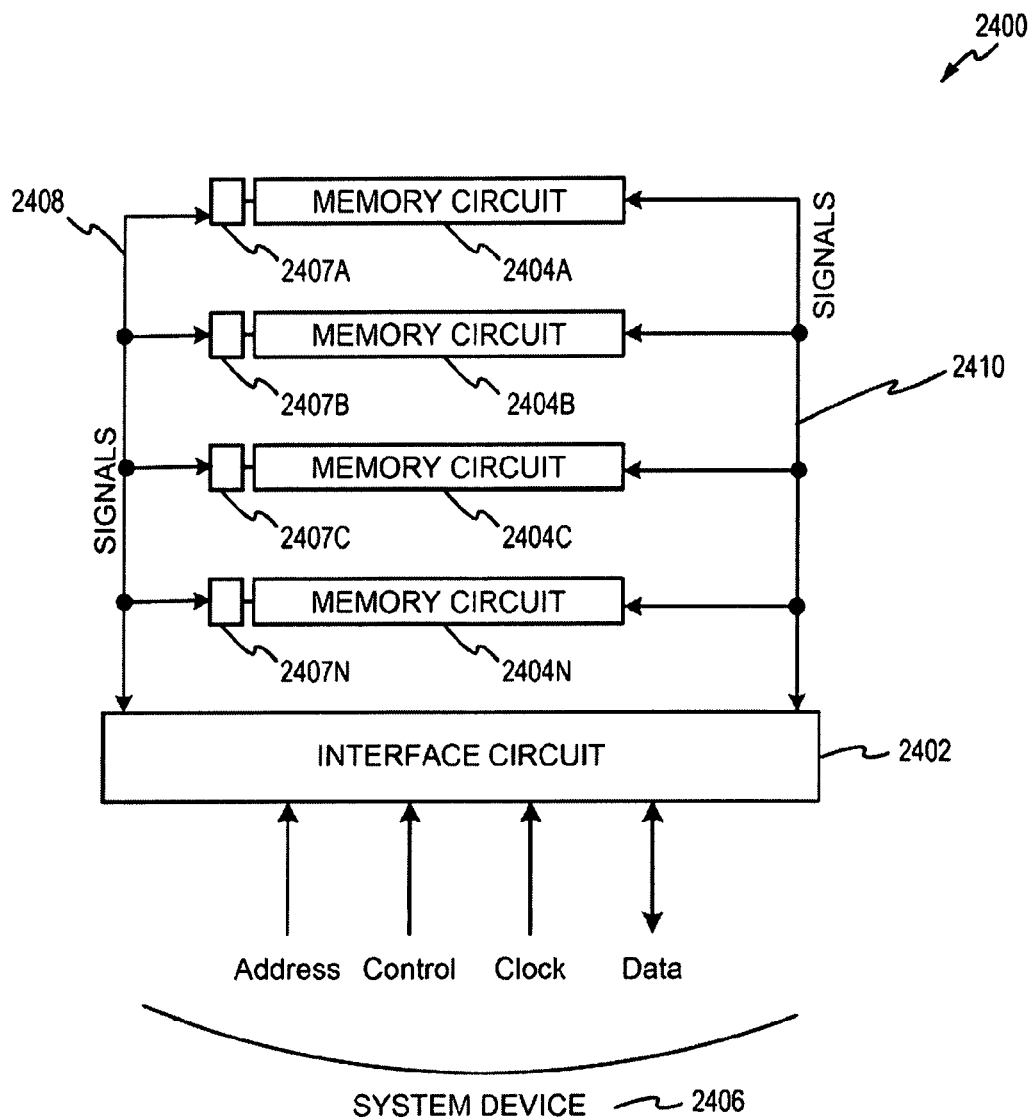
FIG. 24 illustrates a system including a system device coupled to an interface circuit and a plurality of physical memory circuits, in accordance with one embodiment.

FIG. 24 illustrates a system including a system device coupled to an interface circuit and a plurality of physical memory circuits, in accordance with one embodiment. As an option, the system 2400 may be implemented in the context of the details of FIGS. 1-23. For example, the various components (e.g. memory devices, interface circuit, etc.) of FIG. 24 may be coupled to a circuit board [e.g. dual in-line memory module (DIMM)] using any of the techniques set forth in the previous figures. Of course, however, the system 2400 may be implemented in any desired environment. Further, the aforementioned definitions may equally apply to the description below.

As shown, a system device 2406 is coupled to an interface circuit 2402, which is in turn coupled to a plurality of physical memory circuits 2404A-N. In some embodiments, the memory circuit 2404A-N may be connected to one or more intelligent buffers 2407A-N. The physical memory circuits may be any type of memory circuits. In some embodiments, each physical memory circuit is a separate memory chip. For example, each may be a DDR2 DRAM.

In some embodiments, the memory circuits may be symmetrical, meaning each has the same capacity, type, speed, etc., while in other embodiments they may be asymmetrical. For ease of illustration only, four such memory circuits are shown, but actual embodiments may use any plural number of memory circuits. As will be discussed below, the memory chips may optionally be coupled to a memory module (not shown), such as a DIMM.

The system device may be any type of system capable of requesting and/or initiating a process that results in an access of the memory circuits. The system may include a memory controller (not shown) through which it accesses the memory circuits.

The interface circuit may include any circuit or logic capable of directly or indirectly communicating with the memory circuits, such as a memory controller, a buffer chip, advanced memory buffer (AMB) chip, etc. The interface circuit interfaces a plurality of signals 2408 between the system device and the memory circuits. Such signals may include, for example, data signals, address signals, control signals, clock signals, and so forth. In some embodiments, all of the signals communicated between the system device and the memory circuits are communicated via the interface circuit. In other embodiments, some other signals 2410 are communicated directly between the system device (or some component thereof, such as a memory controller, an AMB, or a register) and the memory circuits, without passing through the interface circuit.

As will be explained in greater detail below, the interface circuit presents to the system device an interface to emulated memory devices which differ in some aspect from the physical memory circuits which are actually present. For example, the interface circuit may tell the system device that the number of emulated memory circuits is different than the actual number of physical memory circuits. The terms "emulating", "emulated", "emulation", and the like will be used in this disclosure to signify emulation, simulation, disguising, transforming, converting, and the like, which results in at least one characteristic of the memory circuits appearing to the system device to be different than the actual, physical characteristic.

In some embodiments, the emulated characteristic may be electrical in nature, physical in nature, logical in nature (e.g. a logical interface, etc.), pertaining to a protocol, etc. An example of an emulated electrical characteristic might be a signal, or a voltage level. An example of an emulated physical characteristic might be a number of pins or wires, a number of signals, or a memory capacity. An example of an emulated protocol characteristic might be a timing, or a specific protocol such as DDR3.

In the case of an emulated signal, such signal may be a control signal such as an address signal, a data signal, or a control signal associated with an activate operation, precharge operation, write operation, mode register read operation, refresh operation, etc. The interface circuit may emulate the number of signals, type of signals, duration of signal assertion, and so forth. It may combine multiple signals to emulate another signal.

The interface circuit may present to the system device an emulated interface to e.g. DDR3 memory, while the physical memory chips are, in fact, DDR2 memory. The interface circuit may emulate an interface to one version of a protocol such as DDR2 with 5-5-5 latency timing, while the physical memory chips are built to another version of the protocol such as DDR2 with 3-3-3 latency timing. The interface circuit may emulate an interface to a memory having a first capacity that is different than the actual combined capacity of the physical memory chips.

An emulated timing may relate to latency of e.g. a column address strobe (CAS) latency, a row address to column address latency (tRCD), a row precharge latency (tRP), an activate to precharge latency (tRAS), and so forth. CAS latency is related to the timing of accessing a column of data. tRCD is the latency required between the row address strobe (RAS) and CAS. tRP is the latency required to terminate an open row and open access to the next row. tRAS is the latency required to access a certain row of data between an activate operation and a precharge operation.

The interface circuit may be operable to receive a signal from the system device and communicate the signal to one or more of the memory circuits after a delay (which may be hidden from the system device). Such delay may be fixed, or in some embodiments it may be variable. If variable, the delay may depend on e.g. a function of the current signal or a previous signal, a combination of signals, or the like.

The delay may include a cumulative delay associated with any one or more of the signals. The delay may result in a time shift of the signal forward or backward in time with respect to other signals. Different delays may be applied to different signals. The interface circuit may similarly be operable to receive a signal from a memory circuit and communicate the signal to the system device after a delay.

The interface circuit may take the form of, or incorporate, or be incorporated into, a register, an AMB, a buffer, or the like, and may comply with Joint Electron Device Engineering Council (JEDEC) standards, and may have forwarding, storing, and/or buffering capabilities.

In some embodiments, the interface circuit may perform operations without the system device's knowledge. One particularly useful such operation is a power-saving operation. The interface circuit may identify one or more of the memory circuits which are not currently being accessed by the system device, and perform the power saving operation on those. In one such embodiment, the identification may involve determining whether any page (or other portion) of memory is being accessed. The power saving operation may be a power down operation, such as a precharge power down operation.

The interface circuit may include one or more devices which together perform the emulation and related operations. The interface circuit may be coupled or packaged with the memory devices, or with the system device or a component thereof, or separately. In one embodiment, the memory circuits and the interface circuit are coupled to a DIM.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A system, comprising:
   a first integrated circuit package including a plurality of first integrated circuit package contacts;
   a circuit board physically coupled to the first integrated circuit package by the plurality of first integrated circuit package contacts;
   the circuit board having a first recess, the first recess having a first portion covered by the first integrated circuit package and a second portion not covered by the first integrated circuit package;
   a first electronic component mounted to the circuit board in the first recess, wherein at least a first portion of the first electronic component is covered by the first integrated circuit package, and wherein the circuit board has a second recess at an opposite side of the circuit board relative to the first recess; and
   a third integrated circuit package including a plurality of third integrated circuit package contacts, wherein the circuit board is physically coupled to the third integrated circuit package by the plurality of third integrated circuit contacts, wherein the second recess in the circuit board has a first portion covered by the third integrated circuit package and a second portion not covered by the third integrated circuit package.

2. The system of claim 1, wherein the first electronic component is a passive component.

3. The system of claim 1, wherein the first electronic component is an active component.

4. The system of claim 1, wherein the first recess is formed around a plurality of circuit board contacts of the circuit board.

5. The system of claim 1, wherein the first integrated circuit package includes dynamic random access memory (DRAM).

6. The system of claim 1, wherein the first integrated circuit package consists of an integrated circuit and integrated circuit contacts.

7. The system of claim 1 wherein the entire first electronic component is covered by the first integrated circuit package.

8. The system of claim 1 further comprising:
a second integrated circuit package including a plurality of second integrated circuit package contacts,
wherein the circuit board is physically coupled to the second integrated circuit package by the plurality of second integrated circuit contacts, and
wherein the first recess in the circuit board has a third portion covered by the second integrated circuit package.

9. The system of claim 8 wherein at least a second portion of the first electronic component is covered by the second integrated circuit package.

10. The system of claim 1 further comprising:
a second electronic component mounted to the circuit board in the second recess, wherein at least a first portion of the second electronic component is covered by the first integrated circuit package.

* * * * *